(12) United States Patent
Montazeri

(10) Patent No.: US 9,907,195 B2
(45) Date of Patent: Feb. 27, 2018

(54) APPARATUS HAVING CONNECTION MODULE FOR USE WITH ELECTRICAL MODULE

(71) Applicant: Shahram Montazeri, Newmarket (CA)

(72) Inventor: Shahram Montazeri, Newmarket (CA)

( * ) Notice: Subject to any disclaimer, the term of this patent is extended or adjusted under 35 U.S.C. 154(b) by 94 days.

(21) Appl. No.: 14/867,412

(22) Filed: Sep. 28, 2015

(65) Prior Publication Data

US 2017/0094823 A1 Mar. 30, 2017

(51) Int. Cl.
| H05K 5/02 | (2006.01) |
| H01M 2/20 | (2006.01) |
| H01M 10/42 | (2006.01) |
| H01R 11/30 | (2006.01) |
| H01M 2/10 | (2006.01) |

(52) U.S. Cl.
CPC .......... H05K 5/0247 (2013.01); H01M 2/202 (2013.01); H01M 10/425 (2013.01); H01R 11/30 (2013.01); H05K 5/023 (2013.01); H01M 2/1022 (2013.01); H01M 2/1077 (2013.01)

(58) Field of Classification Search
CPC ........ H05K 5/0247; H05K 5/023; H05K 5/02; H02K 29/08; G11B 33/121
See application file for complete search history.

(56) References Cited

U.S. PATENT DOCUMENTS

| 3,313,995 A | 4/1967 | Bach et al. |
| 4,211,456 A * | 7/1980 | Sears ................. H01R 13/6205 439/39 |
| 4,546,267 A * | 10/1985 | Urfirer ................... H01R 13/22 307/116 |
| 5,345,221 A | 9/1994 | Pons et al. |
| 7,955,155 B2 * | 6/2011 | Tremblay ............. A63H 33/046 446/85 |
| 8,016,599 B1 | 9/2011 | Melby et al. |
| 8,491,312 B2 * | 7/2013 | Rudisill ................. H01R 11/30 439/39 |
| 8,576,031 B2 * | 11/2013 | Lauder .................. G06F 1/1626 206/320 |
| 9,019,718 B2 | 4/2015 | Bdeir |
| 2007/0072442 A1 | 3/2007 | DiFonzo et al. |
| 2008/0166926 A1 * | 7/2008 | Seymour ................... E04B 2/06 439/701 |
| 2010/0248008 A1 * | 9/2010 | Sugawara ........... H01M 2/1077 429/159 |
| 2011/0143629 A1 * | 6/2011 | Seymour ................ A63H 33/04 446/91 |

(Continued)

FOREIGN PATENT DOCUMENTS

| WO | 2013186548 | 12/2013 |
| WO | WO2014032043 | 2/2014 |

*Primary Examiner* — Binh Tran
*Assistant Examiner* — Douglas Burtner

(57) ABSTRACT

An apparatus is for use with an electrical module. The apparatus includes a connection module having a connection housing enclosing a connection electrical circuit. A connection registration feature is configured to be in registered alignment with a registration feature of the electrical module. A connection circuit terminal is electrically connected to the connection electrical circuit. A connection magnet is configured to be magnetically attracted to (or magnetically repelled from) a magnet of the electrical module.

20 Claims, 21 Drawing Sheets

(56) References Cited

U.S. PATENT DOCUMENTS

| | | | |
|---|---|---|---|
| 2011/0155485 A1* | 6/2011 | Tsurumi | H01M 2/0237 180/65.1 |
| 2012/0034507 A1* | 2/2012 | Harada | B60L 11/1874 429/120 |
| 2012/0189155 A1* | 7/2012 | Gabara | H01R 11/30 381/380 |
| 2012/0244399 A1 | 9/2012 | Tartaglia | |
| 2013/0050958 A1* | 2/2013 | Bdeir | H01R 13/6205 361/730 |
| 2013/0343025 A1* | 12/2013 | Bdeir | H01R 13/6205 361/803 |
| 2014/0080361 A1* | 3/2014 | Bulur | H05K 1/18 439/627 |
| 2015/0104689 A1* | 4/2015 | Frias | H01M 2/204 429/121 |
| 2015/0236444 A1* | 8/2015 | Bdeir | H01R 13/6205 361/792 |
| 2016/0111901 A1* | 4/2016 | Waterford | G01R 31/3606 320/107 |
| 2017/0149171 A1* | 5/2017 | Szeto | H01R 13/6205 |

* cited by examiner

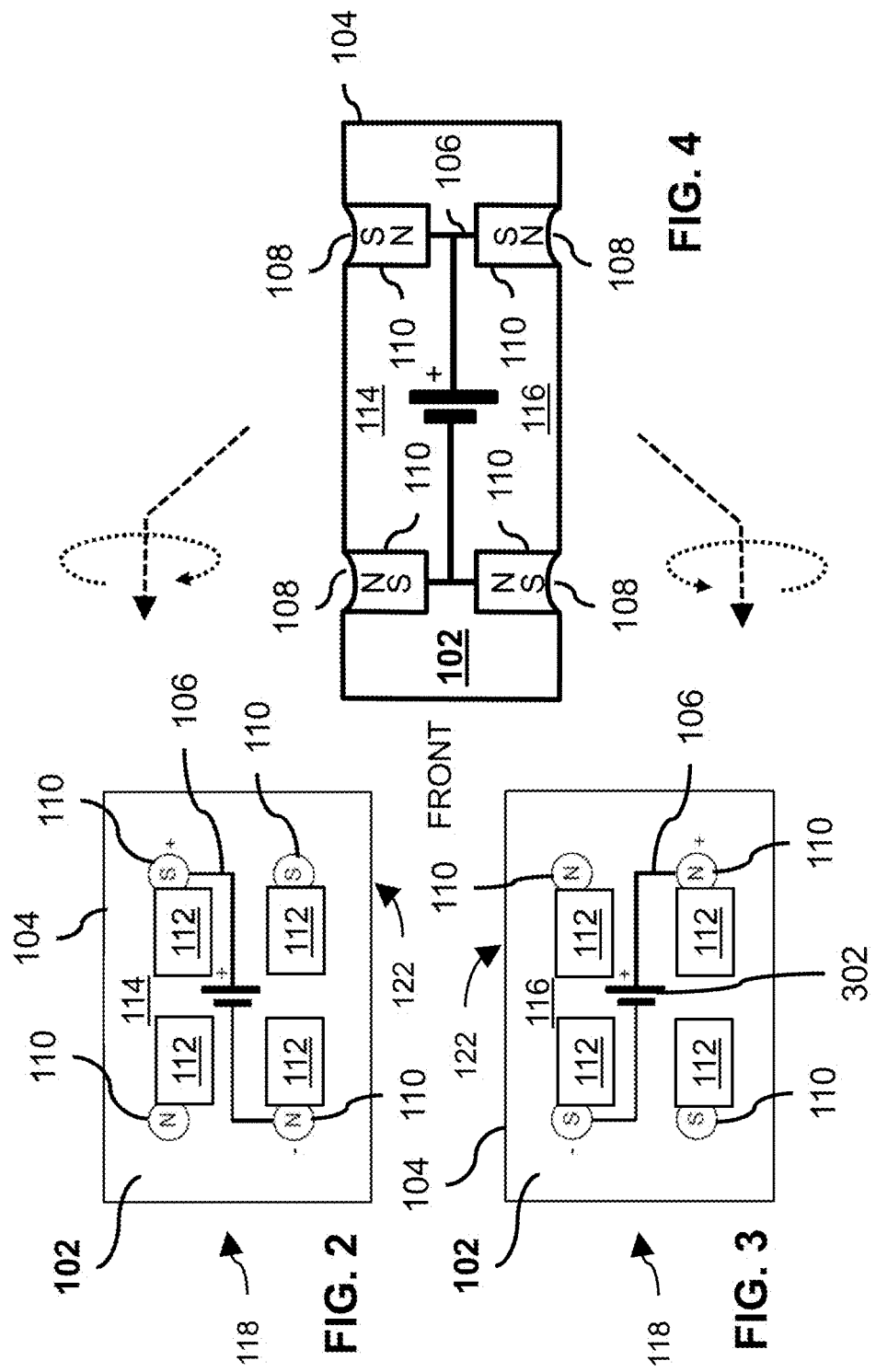

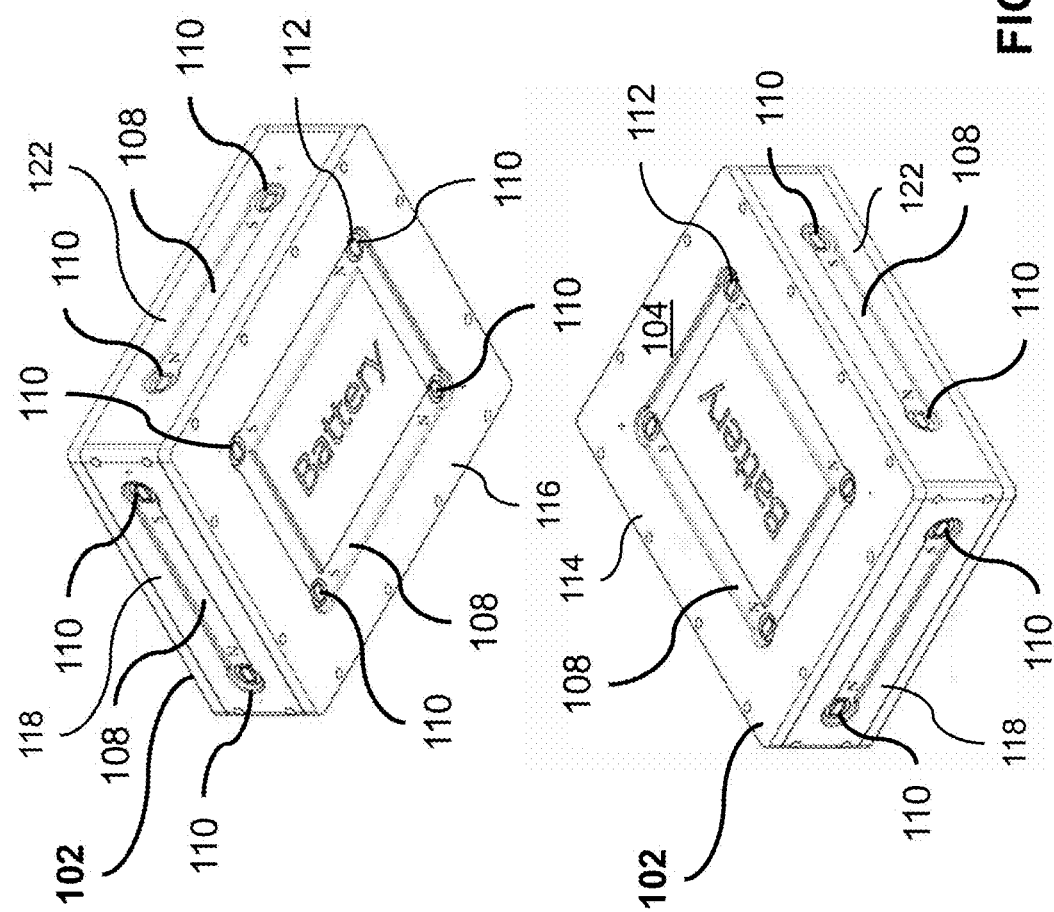

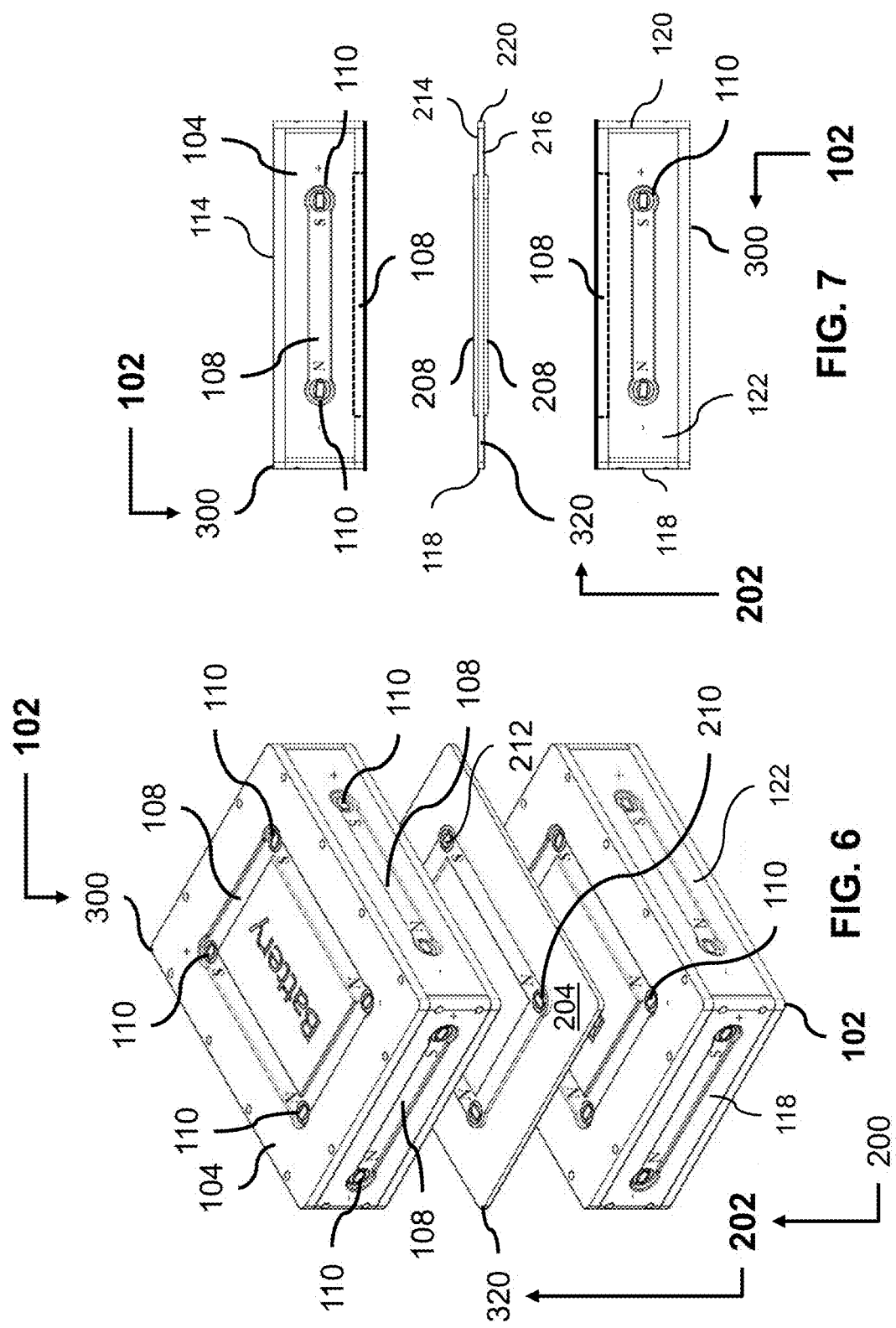

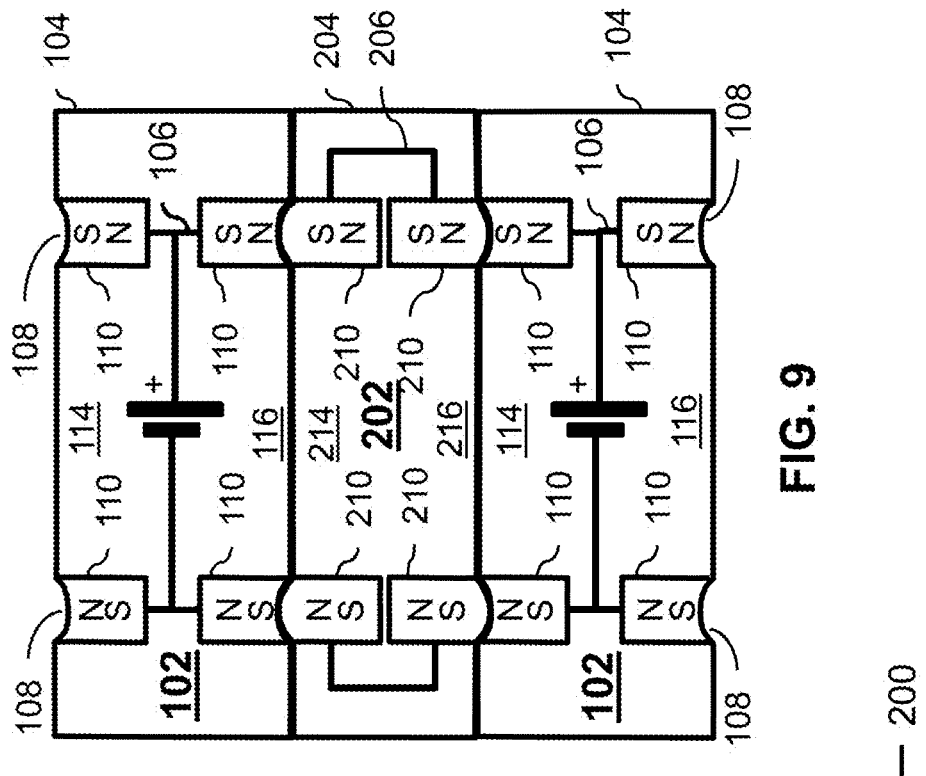
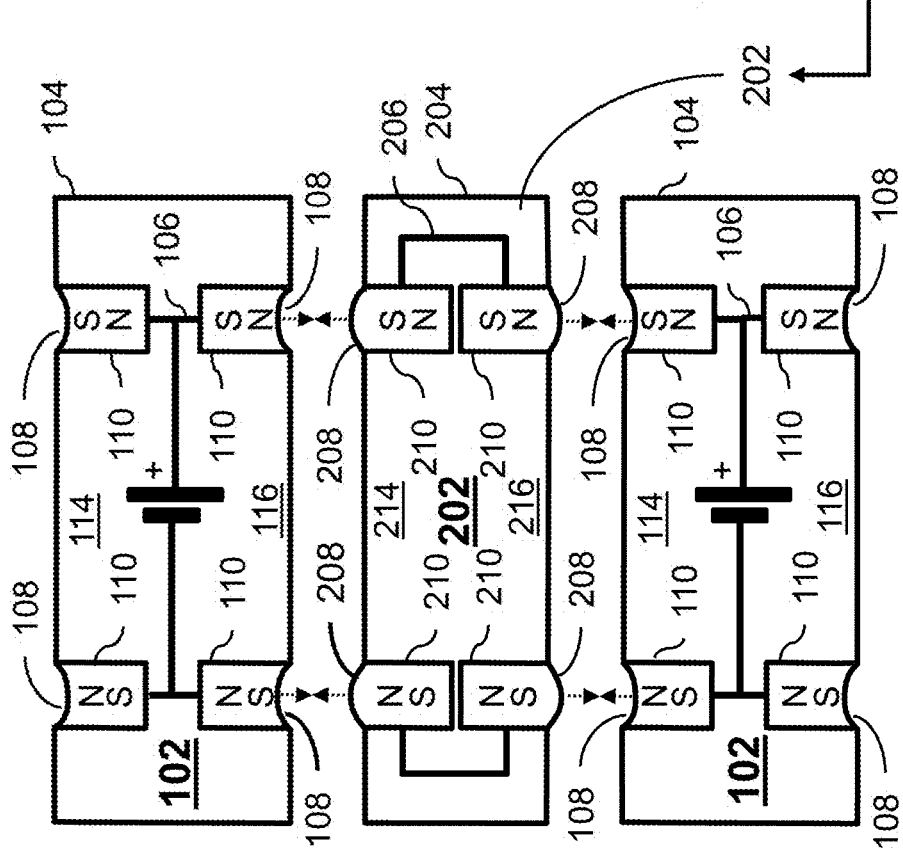
FIG. 8
FIG. 9

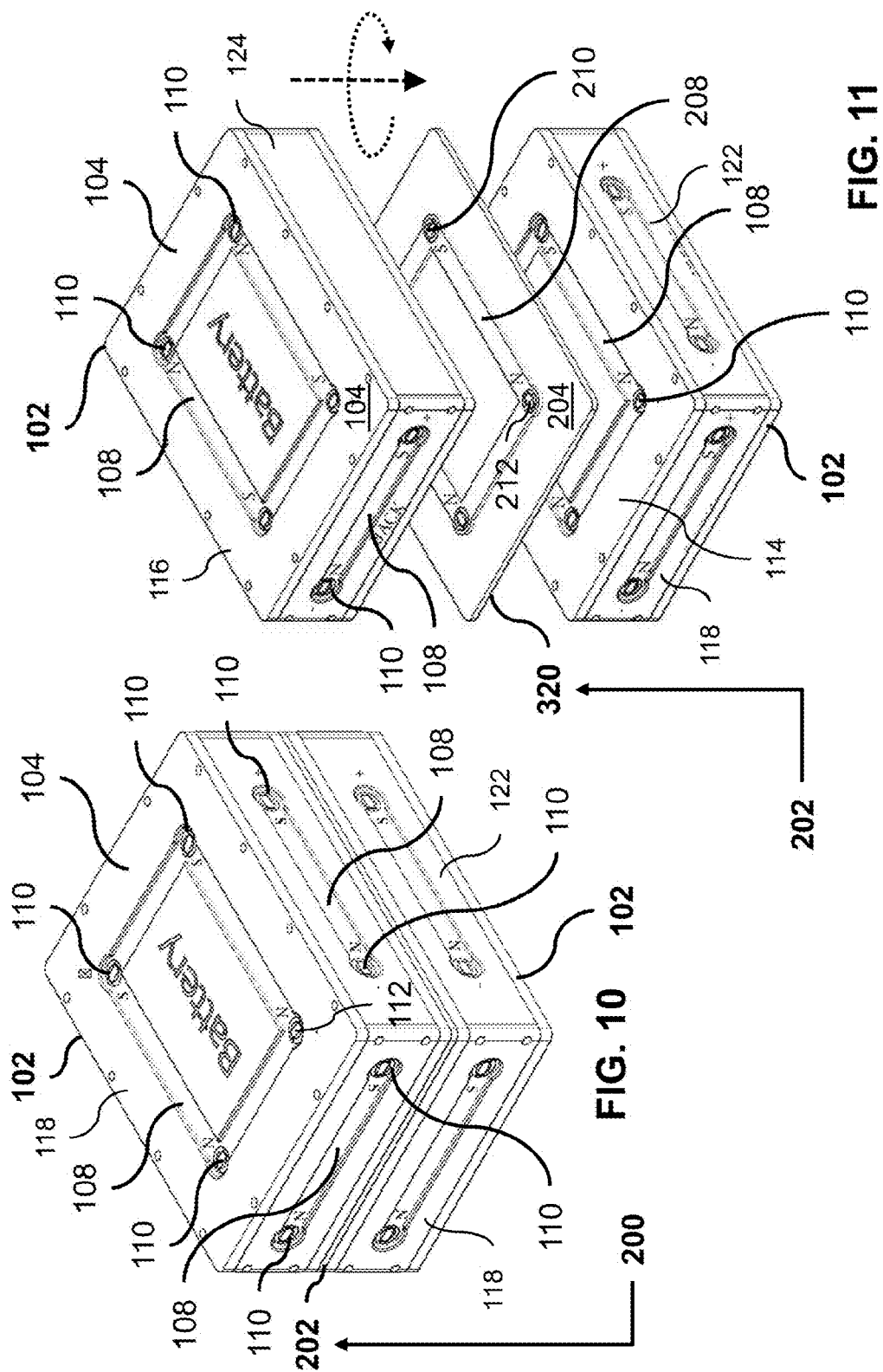

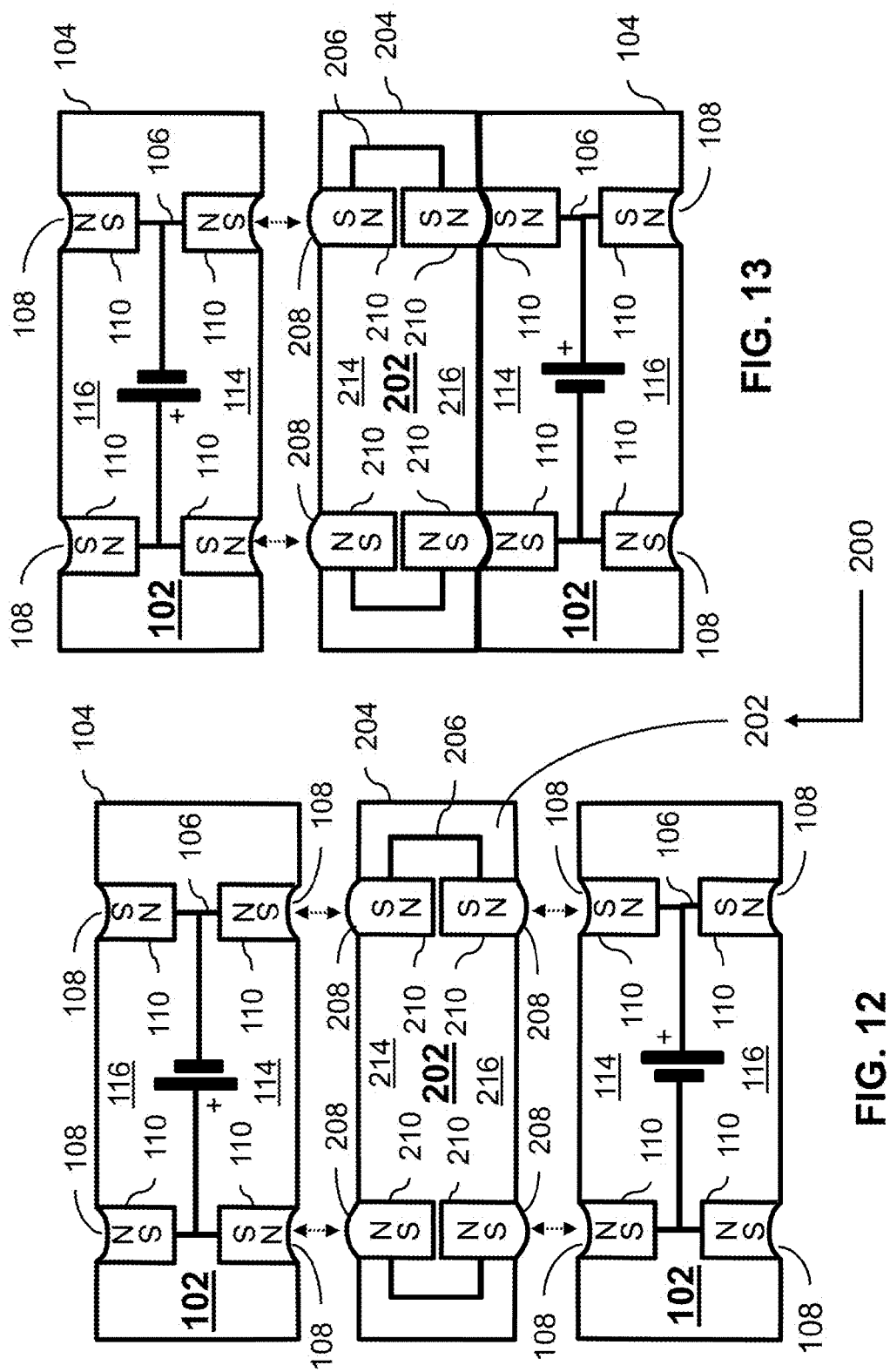

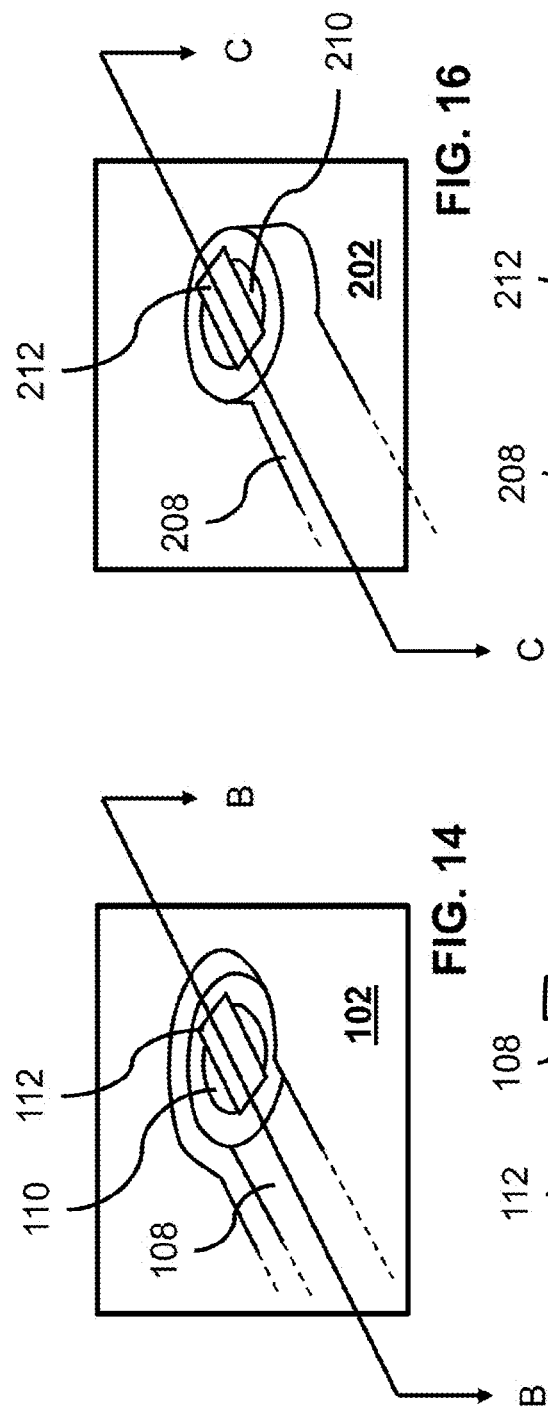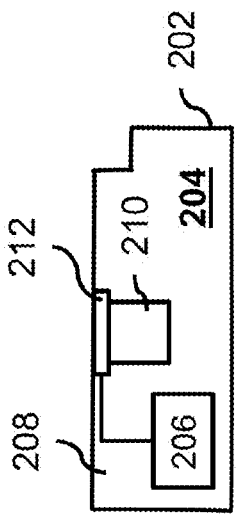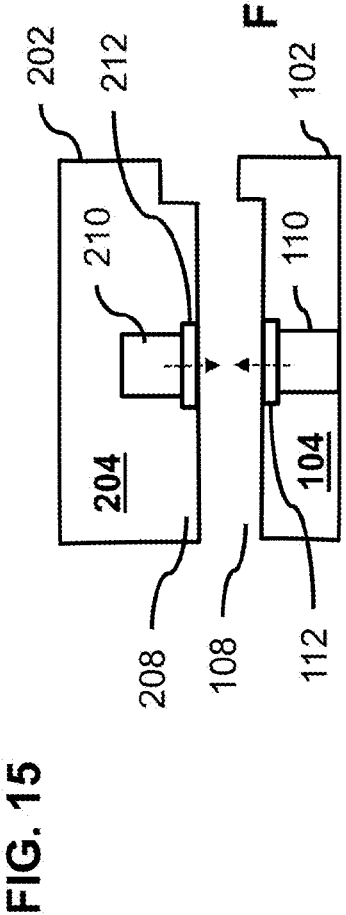

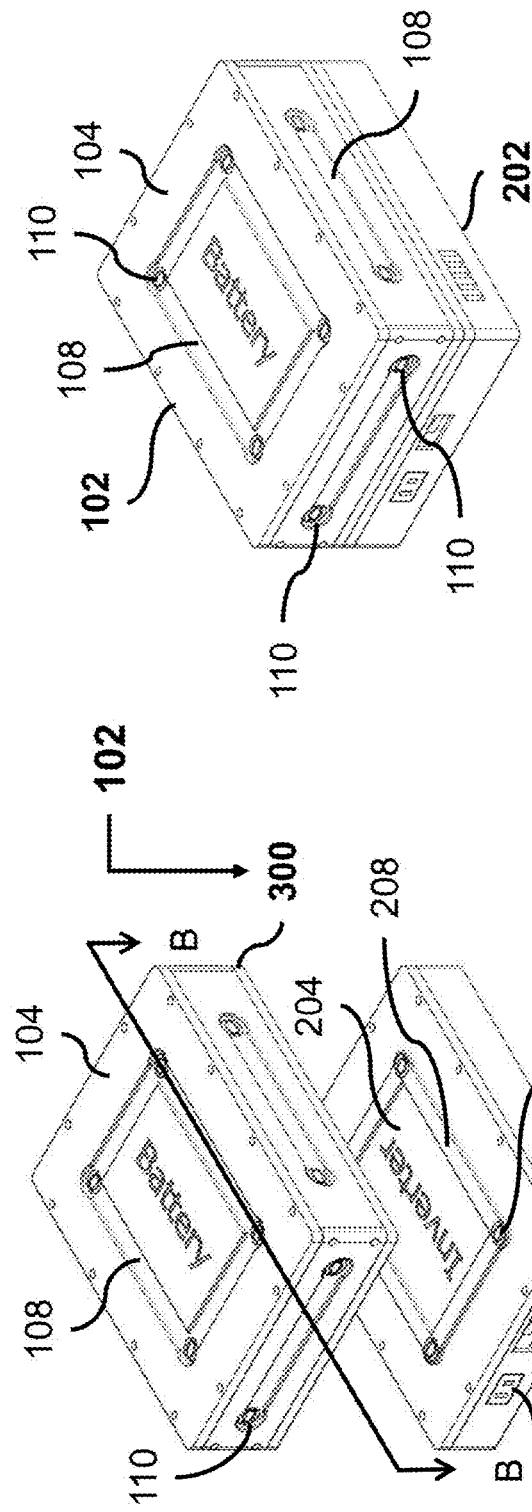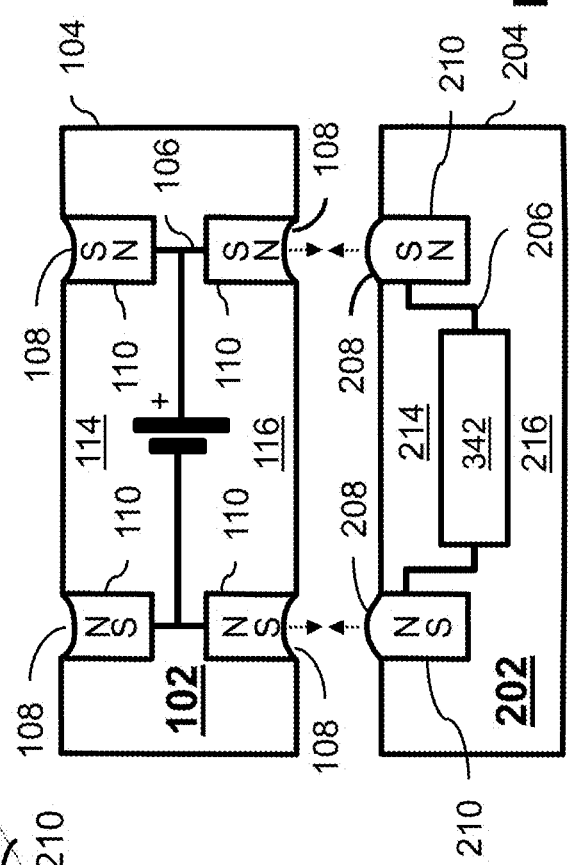

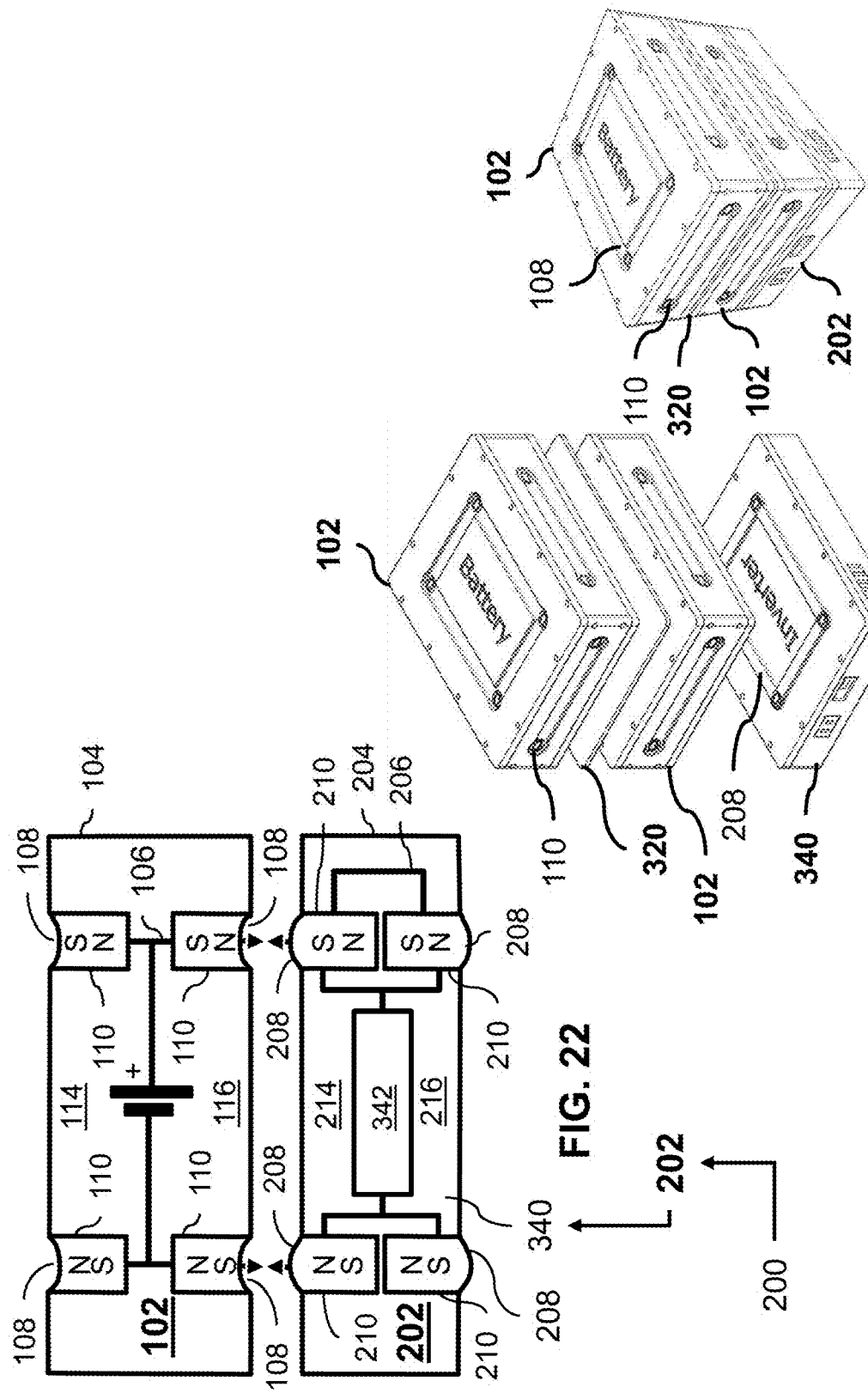

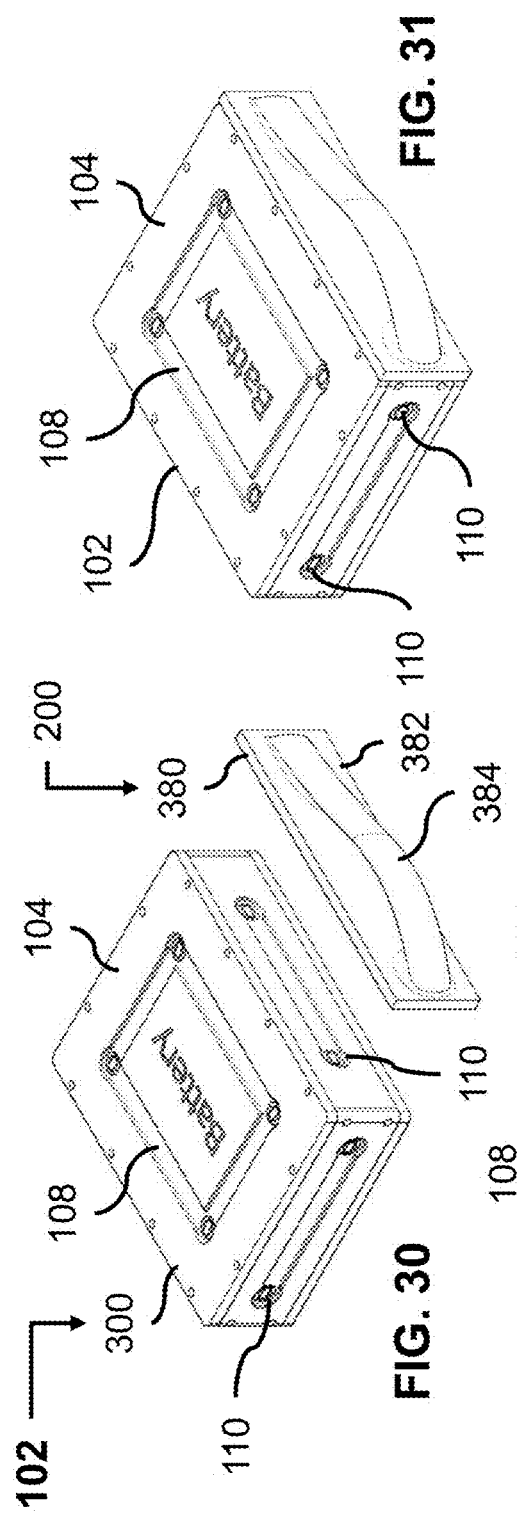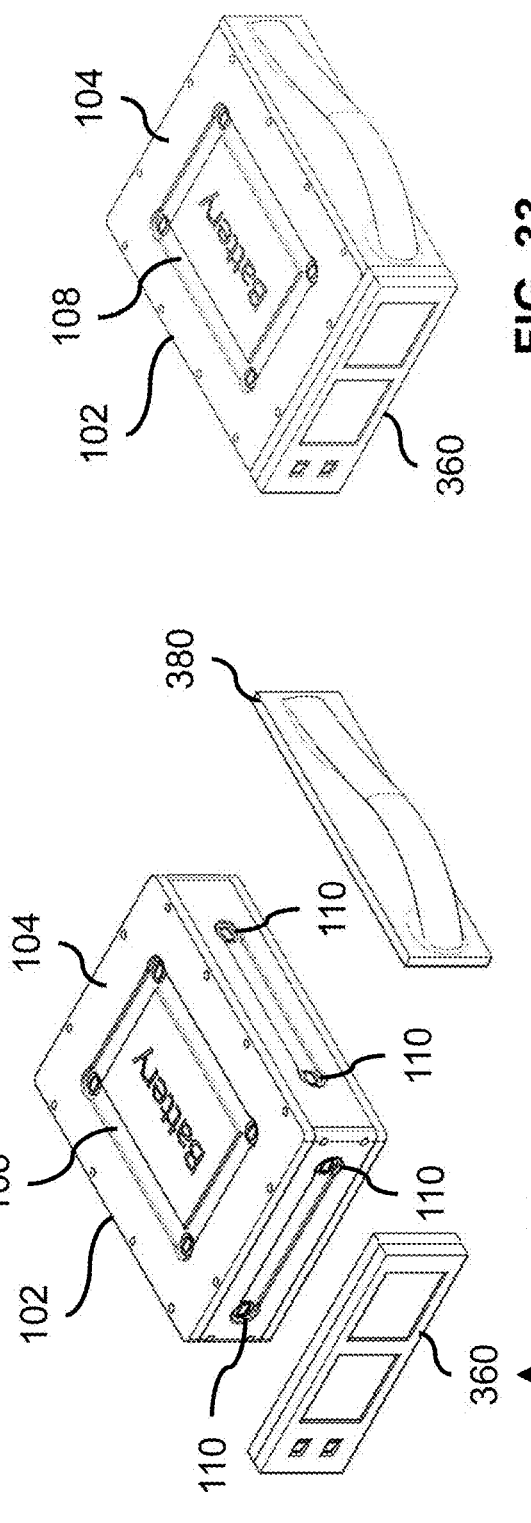

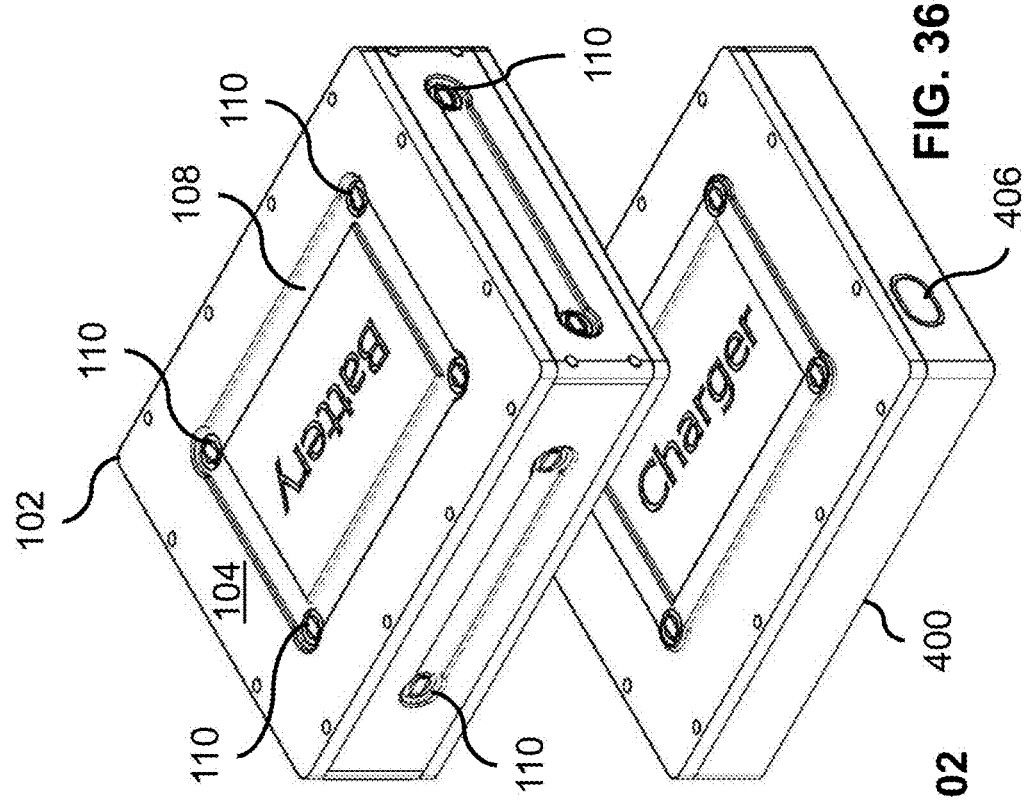
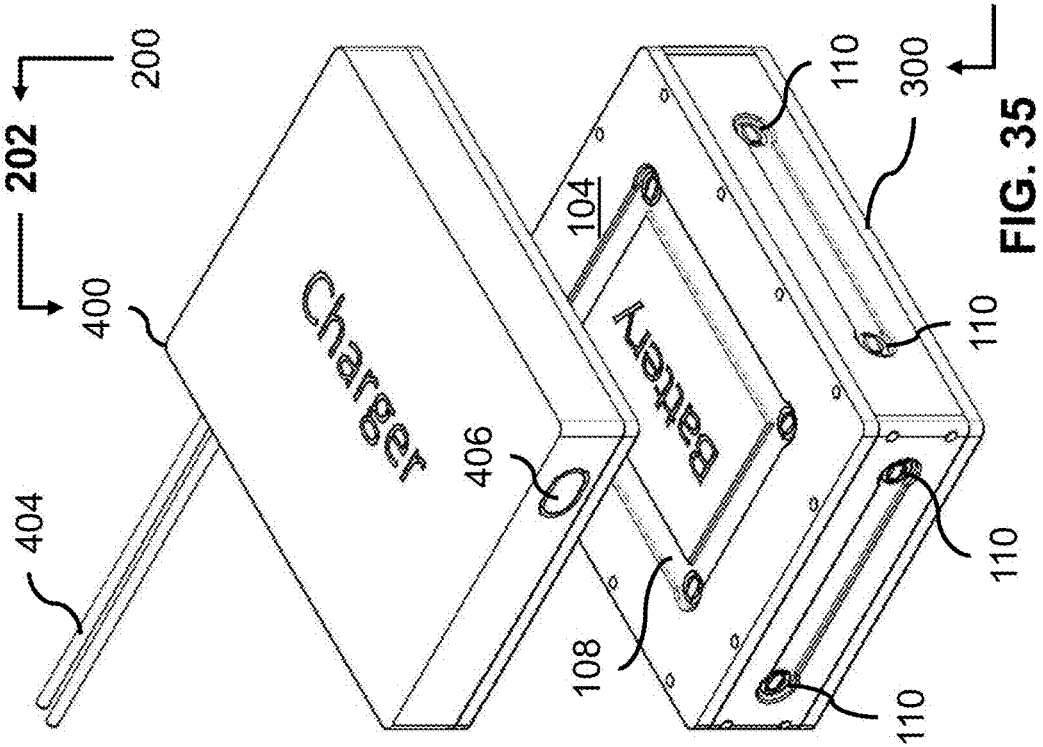

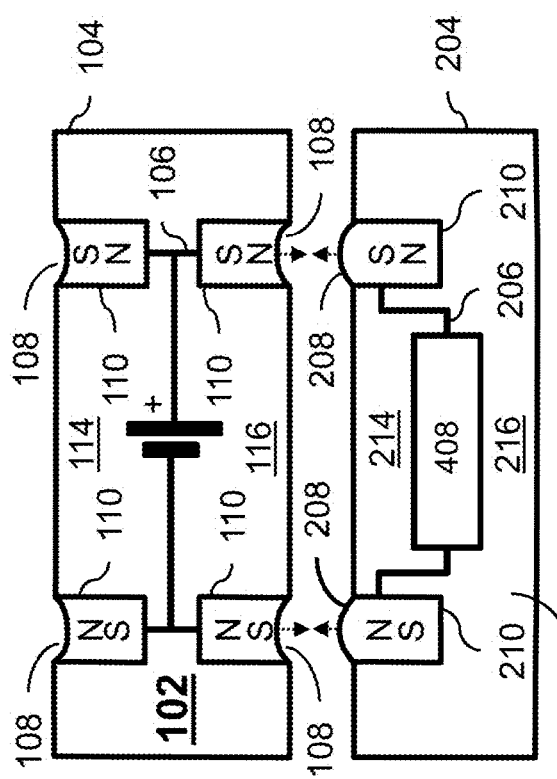
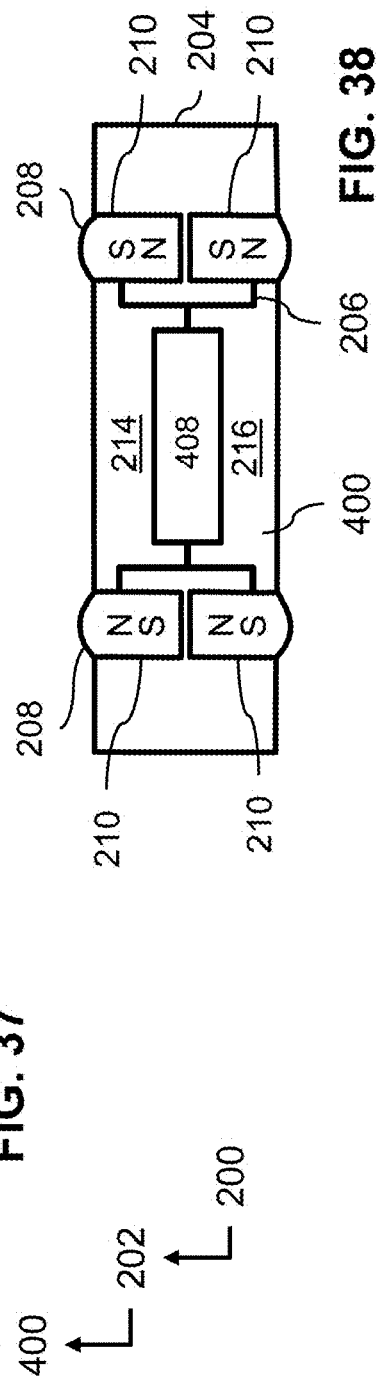

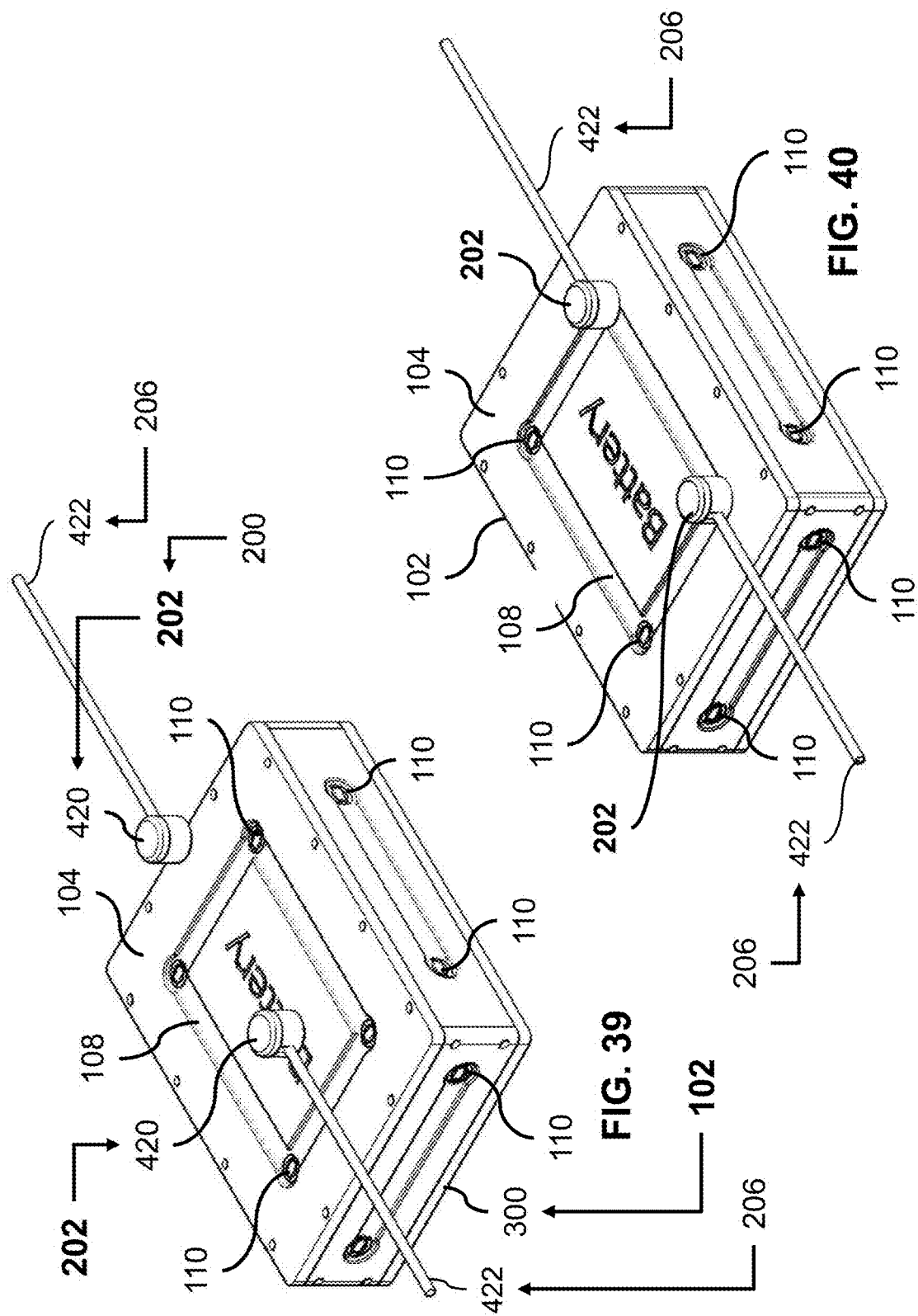

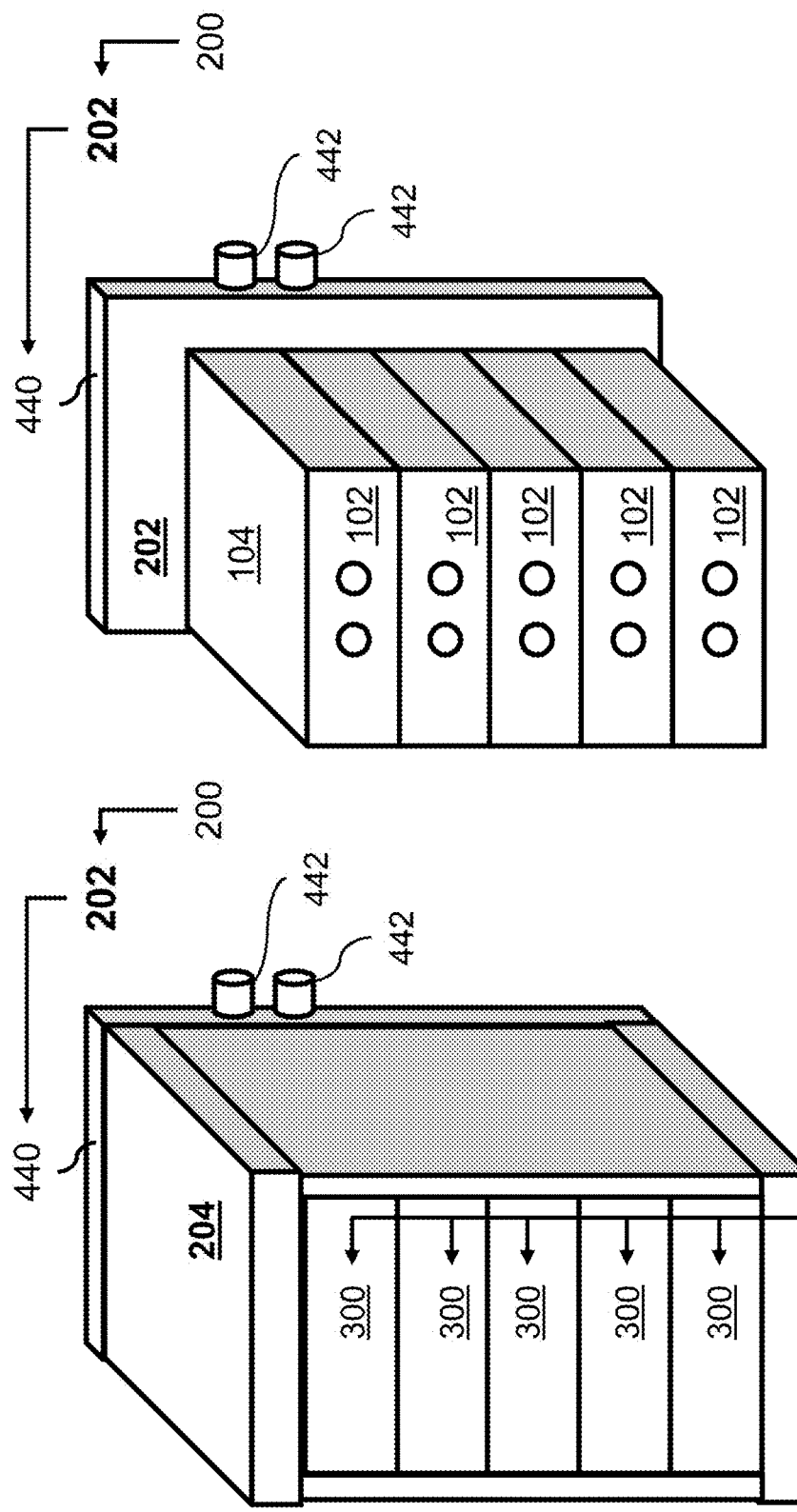

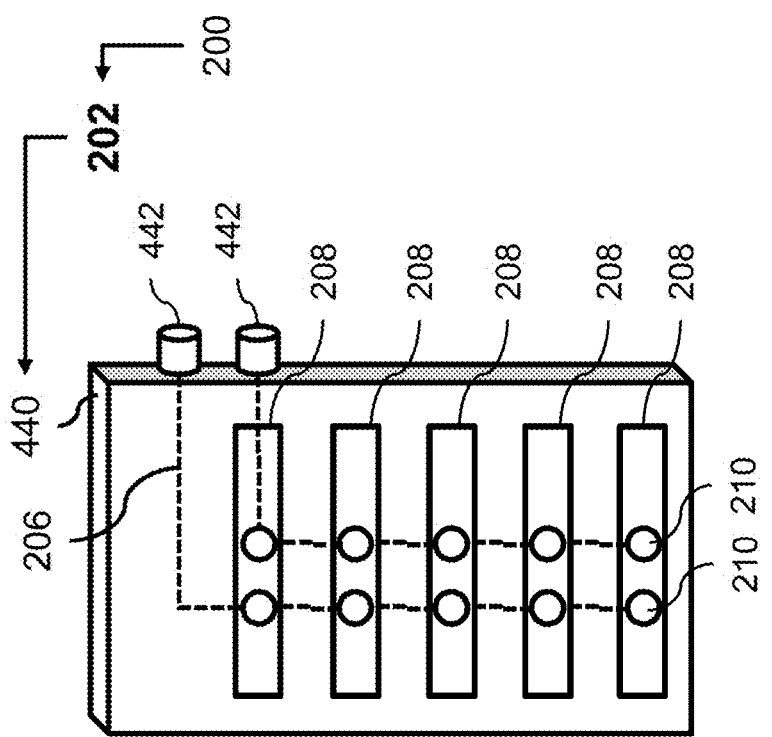
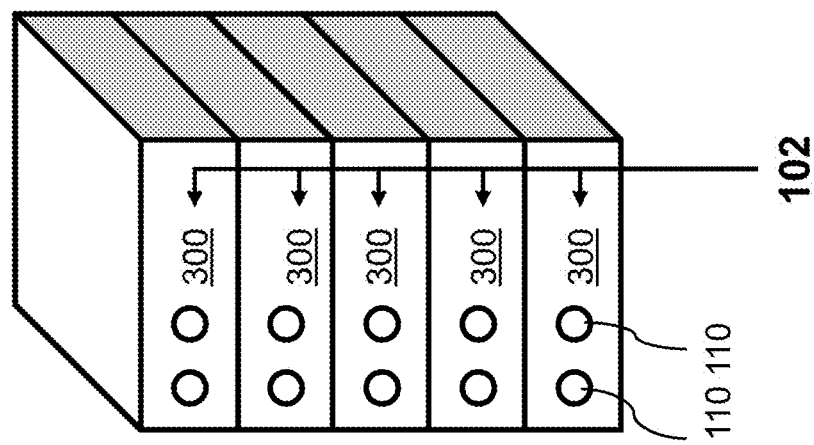
FIG. 44

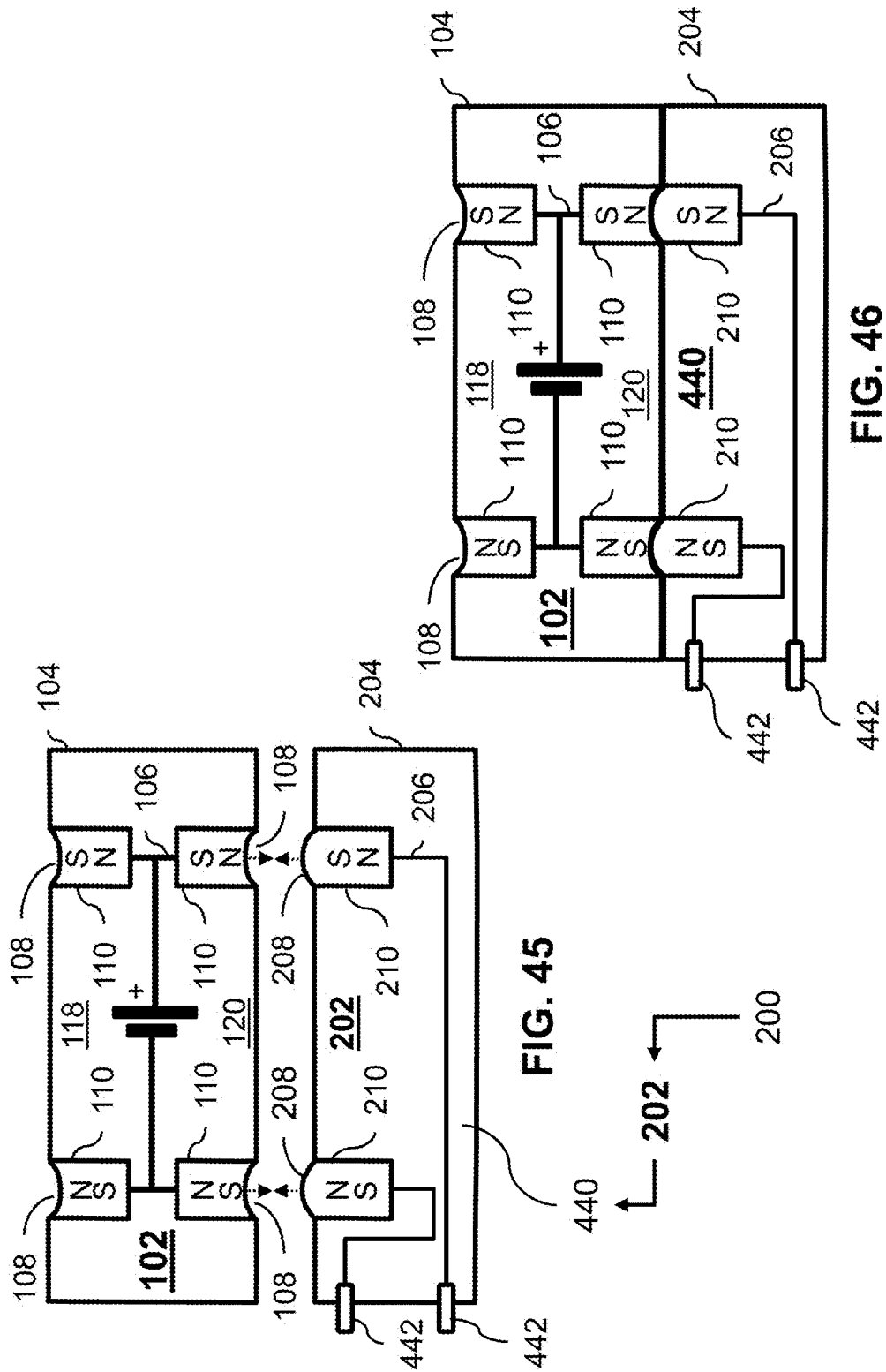

APPARATUS HAVING CONNECTION MODULE FOR USE WITH ELECTRICAL MODULE

TECHNICAL FIELD

This document relates to the technical field of (and is not limited to) an apparatus having a connection module for use with an electrical module.

BACKGROUND

An electrical module (also called an electrical assembly or equipment-packaging system, etc.) includes a housing assembly (also called, an enclosure) configured to house (protect) an electrical circuit having electrical or electronic components and/or devices. Specifically, the housing assembly is configured to (A) prevent, in use, electrical shock to users, and/or (B) protect, in use, the electrical contents that are housed by the housing assembly from unwanted damage (such as, from the environment, short circuits, etc.).

SUMMARY

It will be appreciated that there exists a need to mitigate (at least in part) at least one problem associated with the existing the electrical assemblies having a housing (also called the existing technology). After much study of the known systems and methods with experimentation, an understanding of the problem and its solution has been identified and is articulated as follows:

Users of electrical modules fail to properly connect such electrical modules because of a multitude of reasons, such as: (A) users do not pay attention when connecting such electrical modules, and/or (B) users that are able to safely connect such electrical modules because they are not technically sophisticated.

By way of example, for the case where electrical modules are used in or with solar energy systems (solar panels, etc.), the users, which do not pay proper attention when making electrical connections between the electrical modules, may inadvertently inflict damaged to the electrical modules (beyond repair or too expensive to repair and/or replace).

Electrical modules lack structural arrangements that permit relatively easier connection between the electrical modules by users.

What is needed is an apparatus that can facilitate relatively easier connections between electrical modules, so that users do not have to pay too much attention (for such tasks) and/or users do not have to be very technically sophisticated (for such tasks).

To mitigate, at least in part, at least one problem associated with the existing technology, there is provided (in accordance with a major aspect) an apparatus. The apparatus is for use with an electrical module including a housing securely supporting and enclosing an electrical circuit. A registration feature is positioned relative to an outer surface of the housing. A circuit terminal is supported by the housing. The circuit terminal is electrically connected to the electrical circuit. A magnet is securely supported by the housing. The magnet is positioned relative to the registration feature. The apparatus includes a connection module including a connection housing securely supporting and enclosing a connection electrical circuit. A connection registration feature is positioned relative to an outer surface of the connection housing. The connection registration feature is configured to be in registered alignment with the registration feature (once the electrical module is positioned relative to the connection module just so). A connection circuit terminal is supported by the connection housing. The connection circuit terminal is electrically connected to the connection electrical circuit. A connection magnet is securely supported by the connection housing. The connection magnet is positioned relative to the connection registration feature.

To mitigate, at least in part, at least one problem associated with the existing technology, there is provided (in accordance with a major aspect) an apparatus. The apparatus is for use with an electrical module. The electrical module includes a housing securely supporting and enclosing an electrical circuit. A registration feature is positioned relative to an outer surface of the housing. A circuit terminal is supported by the housing. The circuit terminal is electrically connected to the electrical circuit. A magnet is securely supported by the housing. The magnet is positioned relative to the registration feature. The apparatus includes a connection module. The connection module includes a connection housing securely supporting and enclosing a connection electrical circuit. A connection registration feature is positioned relative to an outer surface of the connection housing. The connection registration feature is configured to be in registered alignment with the registration feature once the electrical module is positioned relative to the connection module just so. A connection circuit terminal is supported by the connection housing. The connection circuit terminal is electrically connected to the connection electrical circuit. A connection magnet is securely supported by the connection housing. The connection magnet is positioned relative to the connection registration feature. The connection magnet is configured to be magnetically attracted to the magnet, depending on magnetic polarity and once the electrical module is positioned relative to the connection module. This is done in such a way that the connection registration feature is positioned in registered alignment with the registration feature, and the circuit terminal and the connection circuit terminal become electrically connected with each other so that the electrical circuit and the connection electrical circuit become electrically connected with each other. The connection magnet is also configured to be magnetically repelled from the magnet, depending on magnetic polarity and once the electrical module is positioned relative to the connection module. This is done in such a way that the connection registration feature is positioned in unregistered alignment with the registration feature, and the circuit terminal and the connection circuit terminal become electrically disconnected from each other so that the electrical circuit and the connection electrical circuit become electrically disconnected from each other.

To mitigate, at least in part, at least one problem associated with the existing technology, there is provided (in accordance with a major aspect) an apparatus. The apparatus is for use with an electrical module including a housing securely protecting an electrical circuit. A registration feature is positioned relative to an outer surface of the housing. A circuit terminal is supported by the housing. The circuit terminal is positioned relative to the registration feature. The circuit terminal is electrically connected to the electrical circuit. A magnet is securely supported by the housing. The magnet is positioned relative to the registration feature. The apparatus includes a connection module configured to be spatially aligned and positioned relative to the electrical module. The connection module includes a connection electrical circuit. A connection housing is configured to securely protect the connection electrical circuit. A connection registration feature is fixedly positioned relative to an outer surface of the connection housing. The connection registration feature is configured to be mated with the registration feature. The connection registration feature is configured to be aligned in registered relationship with the registration feature once the connection module and the electrical module are spatially aligned and positioned relative to each other. A connection circuit terminal is supported by the connection housing. The connection circuit terminal is electrically connected to the connection electrical circuit. The connection circuit terminal is spatially positioned relative to the connection registration feature. The connection circuit terminal is configured to be spatially positioned and aligned relative to the circuit terminal (once the connection registration feature is aligned in registered relationship with the registration feature). The connection circuit terminal is configured to be electrically connected with the circuit terminal (in such a way that the connection electrical circuit and the electrical circuit become electrically connected with each other). A connection magnet is securely supported by the connection housing. The connection magnet is spatially positioned relative to the connection registration feature. The connection magnet is configured to be spatially positioned and aligned (spatially registered) relative to the magnet (once the connection registration feature is aligned in registered relationship with the registration feature).

Other aspects are identified in the claims.

Other aspects and features of the non-limiting embodiments may now become apparent to those skilled in the art upon review of the following detailed description of the non-limiting embodiments with the accompanying drawings.

BRIEF DESCRIPTION OF THE DRAWINGS

The non-limiting embodiments may be more fully appreciated by reference to the following detailed description of the non-limiting embodiments when taken in conjunction with the accompanying drawings, in which:

FIG. 1, FIG. 2, FIG. 3, FIG. 4 and FIG. 5 (SHEETS 1 TO 3 OF 21 SHEETS) depict views of embodiments of an electrical module;

FIG. 6, FIG. 7, FIG. 8, FIG. 9, FIG. 10, FIG. 11, FIG. 12, FIG. 13, FIG. 14, FIG. 15, FIG. 16, FIGS. 17 and 18 (SHEETS 4 TO 8 OF 21 SHEETS) depict views of embodiments of an apparatus for use with the electrical module of FIG. 1;

FIG. 19, FIG. 20, FIG. 21, FIG. 22, FIG. 23, FIG. 24, FIG. 25 and FIG. 26 (SHEETS 9 TO 11 OF 21 SHEETS) depict views of embodiments of the apparatus of FIG. 6;

FIG. 30, FIG. 31, FIG. 32 and FIG. 33 (SHEET 13 OF 21 SHEETS) depict views of embodiments of the apparatus of FIG. 6;

FIG. 34, FIG. 35, FIG. 36, FIG. 37 and FIG. 38 (SHEETS 14 TO 16 OF 21 SHEETS) depict views of the apparatus of FIG. 6;

FIG. 39, FIG. 40 and FIG. 41 (SHEETS 17 AND 18 OF 21 SHEETS) depict views of embodiments of the apparatus of FIG. 6; and FIG. 42, FIG. 43, FIG. 44, FIG. 45 and FIG. 46 (SHEETS 19 TO 21 OF 21 SHEETS) depict views of embodiments of the apparatus of FIG. 6.

Figure 1:
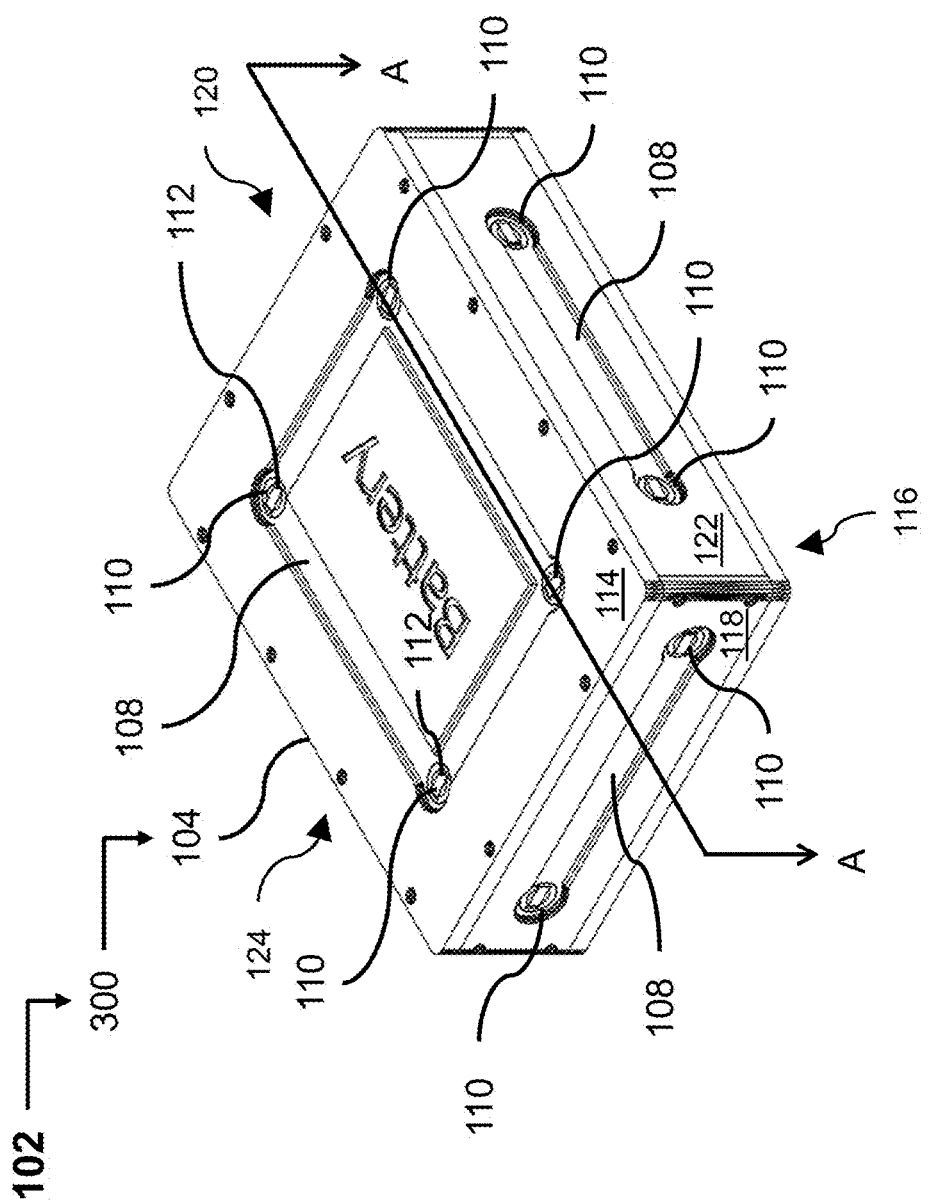

The drawings are not necessarily to scale and may be illustrated by phantom lines, diagrammatic representations and fragmentary views. In certain instances, details unnecessary for an understanding of the embodiments (and/or details that render other details difficult to perceive) may have been omitted.

Corresponding reference characters indicate corresponding components throughout the several figures of the drawings. Elements in the several figures are illustrated for simplicity and clarity and have not been drawn to scale. The dimensions of some of the elements in the figures may be emphasized relative to other elements for facilitating an understanding of the various disclosed embodiments. In addition, common, but well-understood, elements that are useful or necessary in commercially feasible embodiments are often not depicted to provide a less obstructed view of the embodiments of the present disclosure.

LISTING OF REFERENCE NUMERALS USED IN THE DRAWINGS 102 electrical module
104 housing
106 electrical circuit
108 registration feature
110 magnet
112 circuit terminal
112 circuit terminals
114 top side panel
116 bottom side panel
118 front side panel
120 back side panel
122 right side panel
124 left side panel
200 apparatus
202 connection module
204 connection housing
206 connection electrical circuit
208 connection registration feature
210 connection magnet
212 connection circuit terminal
214 top side panel
216 bottom side panel
218 front side panel
220 back side panel
300 battery assembly
302 battery
320 joiner assembly
340 inverter assembly
342 inverter unit
343 power outlet
344 computer peripheral outlet
346 vent port
360 light assembly
362 light-emitting element
364 switch element
380 handle assembly
382 base section
384 handle portion
400 electrical-charging assembly
402 solar panel assembly
404 panel wire
406 power switch
408 charger unit
420 wiring-connection assembly
422 electrical conductor
440 backplane assembly
442 backplane terminals

DETAILED DESCRIPTION OF THE NON-LIMITING EMBODIMENT(S)

The following detailed description is merely exemplary and is not intended to limit the described embodiments or the application and uses of the described embodiments. As used, the word "exemplary" or "illustrative" means "serving as an example, instance, or illustration." Any implementation described as "exemplary" or "illustrative" is not necessarily to be construed as preferred or advantageous over other implementations. All of the implementations described below are exemplary implementations provided to enable persons skilled in the art to make or use the embodiments of the disclosure and are not intended to limit the scope of the disclosure. The scope of the invention is defined by the claims. For the description, the terms "upper," "lower," "left," "rear," "right," "front," "vertical," "horizontal," and derivatives thereof shall relate to the examples as oriented in the drawings. There is no intention to be bound by any expressed or implied theory in the preceding Technical Field, Background, Summary or the following detailed description. It is also to be understood that the devices and processes illustrated in the attached drawings, and described in the following specification, are exemplary embodiments (examples), aspects and/or concepts defined in the appended claims. Hence, dimensions and other physical characteristics relating to the embodiments disclosed are not to be considered as limiting, unless the claims expressly state otherwise. It is understood that the phrase "at least one" is equivalent to "a". The aspects (examples, alterations, modifications, options, variations, embodiments and any equivalent thereof) are described regarding the drawings. It should be understood that the invention is limited to the subject matter provided by the claims, and that the invention is not limited to the particular aspects depicted and described.

FIG. 1, FIG. 2, FIG. 3, FIG. 4 and FIG. 5 depict views of embodiments of an electrical module 102. FIG. 1 depicts a perspective view of an embodiment of the electrical module 102. FIG. 2 and FIG. 3 depict schematic views of embodiments of an interior of the electrical module 102 of FIG. 1. FIG. 4 depicts a cross-sectional view (through a cross-sectional line A-A of FIG. 1) of an embodiment of the electrical module 102 of FIG. 1. FIG. 5 depicts a perspective view of embodiments of the electrical module 102 of FIG. 1.

Referring to the embodiment as depicted in FIG. 1, the electrical module 102 includes (and is not limited to) a synergistic combination of a housing 104, an electrical circuit 106, a registration feature 108, a magnet 110 (such as a disk-shaped magnet), and a circuit terminal 112.

In accordance with a specific or a preferred embodiment as depicted in FIG. 1 (and equally applicable to the embodiments as depicted in FIG. 2, FIG. 3, FIG. 4 and FIG. 5), the electrical module 102 includes (and is not limited to) a battery assembly 300 having a battery 302 (as depicted in FIG. 3) with wiring connecting the battery 302 with the circuit terminal 112. The wiring connecting the battery 302 with the circuit terminal 112 may be arranged either directly or indirectly as depicted in FIG. 4 via the magnet 110. For instance, the battery assembly 300 provides a battery (at least one or more batteries) configured to convert stored chemical energy into electrical energy. Each cell has a positive terminal, or cathode, and a negative terminal, or anode. The terminal marked positive is at a higher electrical potential energy than is the terminal marked negative. The terminal marked positive is the source of electrons that when connected to an external circuit, may flow and deliver energy to an external device. Although the term "battery" technically means a device with multiple cells, single cells may also be called batteries.

The housing 104 securely supports and encloses the electrical circuit 106. The housing 104 supports and encloses the electrical circuit 106 in such a way that the housing 104 substantially protects the electrical circuit 106 from inadvertent (unwanted) physical damage. Embodiments of the electrical circuit 106 are depicted in FIG. 2 and FIG. 3.

The registration feature 108 is positioned relative to an outer surface of the housing 104. Preferably, the registration feature 108 is positioned proximate to an outer surface of the housing 104. More preferably, the registration feature 108 is positioned, at least in part, on an outer surface of the housing 104. Even more preferably, the housing 104 forms (provides) the registration feature 108. The registration feature 108 is any one of (A) integral to the housing 104, and (B) configured to be connectable to (directly or indirectly) and disconnectable from (directly or indirectly) the housing 104, etc.

The magnet 110 is securely supported by the housing 104. The magnet 110 is positioned relative to the registration feature 108. Preferably, the magnet 110 is positioned proximate to the registration feature 108. More preferably, the magnet 110 is positioned, at least in part, within the registration feature 108. Even more preferably, the magnet 110 is electrically connected (operatively coupled) to the electrical circuit 106 (as depicted in FIG. 2 and FIG. 3).

The circuit terminal 112 is supported by the housing 104. The circuit terminal 112 is electrically connected to the electrical circuit 106 (as depicted in FIG. 2, FIG. 3 and FIG. 15). Preferably, the circuit terminal 112 is positioned relative to the magnet 110. More preferably, the circuit terminal 112 is positioned relative to the magnet 110, and the magnet 110 is exposed, at least in part, on an exterior of the housing 104. Even more preferably, the circuit terminal 112 is positioned, at least in part, on a portion of the magnet 110 (and faces outwardly from an exterior of the connection housing 204).

In accordance with a preferred embodiment as depicted in FIG. 1, the housing 104 includes housing-panel sections (preferably, a quantity of eight such panels) that are positioned and affixed to each other in such a way that the housing-panel sections securely surround the interior of the housing 104 (to keep the interior safe from unwanted damage, etc.). The housing 104 forms an elongated box structure (preferably having rectangular-shaped sides and/or square-shaped sides). Preferably, the housing-panel sections of the housing 104 includes a top side panel 114, a bottom side panel 116, a front side panel 118, a back side panel 120, a right side panel 122 and a left side panel 124.

In accordance with the embodiment as depicted in FIG. 1 (and FIG. 15), the registration feature 108 includes a groove (an elongated groove or channel) formed on the outer surface of the housing 104, in which the groove is recessed below the outer surface of the housing 104. Preferably, the magnet 110 is positioned in the groove (the registration feature 108). This is done in such a way that an outer surface of the magnet 110 is recessed below the outer surface of the housing 104. Preferably, the outer surface of the magnet 110 is positioned at the lower section of the groove (the registration feature 108).

In accordance with the embodiments as depicted in FIG. 2 and FIG. 3, the electrical circuit 106 is entirely enclosed by the housing 104. The housing 104 is configured to physically protect and shield the contents (such as, the electrical circuit 106) housed in the interior of the housing 104 (from unwanted damage). Preferably, the electrical circuit 106 is electrically connected (operatively coupled) to the magnet 110. It will be appreciated that the electrical circuit 106 may include any one of a complete electrical circuit or a partial electrical circuit (an incomplete electrical circuit). It will be appreciated that the electrical circuit 106 may include any type of electrical or electronic component, such as a wire configured to convey an electrical current, a resistor element, a capacitor element, an inductor element, a fuse element, a transistor element, a micro-controller, a battery, a battery management system, etc., and any combination and/or permutation thereof (and any equivalent thereof, all known and not depicted explicitly per se and not described). It will be appreciated that a portion of the electrical circuit 106 may extend (at least in part) from the interior of the housing 104 to the exterior of the housing 104. For instance, a circuit terminal 112 (or a pair of circuit terminals 112) of the electrical circuit 106 may extend from the interior of the housing 104 to the exterior of the housing 104, or may be exposed to the exterior of the housing 104. Each instance of the magnet 110 has a corresponding instance of the circuit terminal 112 configured to make physical contact with an instance of the magnet 110 associated with the electrical module 102.

In accordance with the embodiment as depicted in FIG. 1, the electrical module 102 includes the top side panel 114 in which the registration feature 108 forms a rectangular-shaped groove formed in the top side panel 114, and the registration feature 108 faces outwardly. There are four instances of the magnet 110 and four instances of the circuit terminal 112 mounted in the registration feature 108 (formed by the top side panel 114). The electrical module 102 includes the right side panel 122 in which the registration feature 108 forms a linear-shaped groove formed in the right side panel 122, and the registration feature 108 faces outwardly. There are two instances of the magnet 110 and two instances of the circuit terminal 112 mounted in the registration feature 108 formed by the right side panel 122.

In accordance with the embodiment as depicted in FIG. 5, the electrical module 102 includes the bottom side panel 116 in which the registration feature 108 forms a rectangular-shaped groove formed in the bottom side panel 116, and the registration feature 108 faces outwardly. There are four instances of the magnet 110 and four instances of the circuit terminal 112 mounted in the registration feature 108 (formed by the bottom side panel 116). The electrical module 102 includes the front side panel 118 in which the registration feature 108 forms a linear-shaped groove formed in the front side panel 118, and the registration feature 108 faces outwardly. There are two instances of the magnet 110 and two instances of the circuit terminal 112 mounted in the registration feature 108 formed by the front side panel 118 (the configuration of the right side panel 122 is similar to the configuration of the front side panel 118).

FIG. 6, FIG. 7, FIG. 8, FIG. 9, FIG. 10, FIG. 11, FIG. 12, FIG. 13, FIG. 14, FIG. 15, FIG. 16, FIG. 17 and FIG. 18 depict views of embodiments of an apparatus 200 for use with the electrical module 102 of FIG. 1. FIG. 6 depicts a perspective view of an embodiment of the apparatus 200. FIG. 7 depicts a side view of an embodiment of the apparatus 200 of FIG. 6. FIG. 8 and FIG. 9 depict schematic views of embodiments of an interior of the apparatus 200 of FIG. 6. FIG. 10 depicts a perspective view of an embodiment of the apparatus 200 of FIG. 6. FIG. 11 depicts a perspective view of an embodiment of the apparatus 200, in which the apparatus 200 is spatially repositioned relative to at least one instance of the electrical module 102 (as depicted in FIG. 10). FIG. 12 and FIG. 13 depict schematic views of embodiments of an interior of the apparatus 200 of FIG. 11. FIG. 14 depicts a perspective view of an embodiment of the electrical module 102 as depicted in FIG. 6. FIG. 15 depicts a cross-sectional view (through a cross-sectional line B-B of FIG. 14) of an embodiment of the electrical module 102 of FIG. 14. FIG. 16 depicts a perspective view of an embodiment of the apparatus 200 of FIG. 6. FIG. 17 depicts a cross-sectional view (through a cross-sectional line C-C of FIG. 16) of an embodiment of the apparatus 200 of FIG. 16. FIG. 18 depicts a cross-sectional view of an embodiment of the apparatus 200 of FIG. 17 to be operatively connected with the electrical module 102 of FIG. 15.

Referring to the embodiment as depicted in FIG. 6, the apparatus 200 is for use with the electrical module 102. The apparatus 200 includes a connection module 202. The connection module 202 includes a synergistic combination of a connection housing 204, a connection registration feature 208, a connection magnet 210 and a connection circuit terminal 212.

In accordance with specific or preferred embodiments as depicted in FIG. 6 and FIG. 7 (and equally applicable to the embodiments as depicted in FIG. 8, FIG. 9, FIG. 10, FIG. 11, FIG. 12, FIG. 13, FIG. 14, FIG. 15, FIG. 16, FIG. 17 and FIG. 18), the connection module 202 includes (and is not limited to) or is a part of a joiner assembly 320 configured to electrically couple an instance of the electrical module 102 with another instance of the electrical module 102. More preferably, the connection module 202 includes (and is not limited to) or is a part of the joiner assembly 320, and the electrical module 102 includes (and is not limited to) the battery assembly 300. For instance, the electrical module 102 includes the battery assembly 300 having the battery 302, and the connection module 202 includes the joiner assembly 320 configured to electrically couple an instance of the battery assembly 300 with another instance of the battery assembly 300. Preferably, the joiner assembly 320 is configured to operatively join one instance of the battery assembly 300 with another instance of the battery assembly 300. More preferably, the joiner assembly 320 is configured to operatively join one instance of the battery assembly 300 with another instance of the battery assembly 300. Preferably, the battery assembly 300 has the registration feature 108 in which the registration feature 108 is recessed into the body of the housing. In this arrangement, the battery assembly 300 cannot be (are not) connected to another instance of the battery assembly 300 without the usage of the joiner assembly 320. For this case, the joiner assembly 320 is a safety feature that prevents users from accidentally joining two instances of the battery assembly 300 together.

In accordance with the embodiment as depicted in FIG. 7, the connection module 202 includes a top side panel 214, a bottom side panel 216, a front side panel 218, a back side panel 220, a right side panel and a left side panel, etc. The connection registration feature 208 extends outwardly from the connection module 202, and the registration feature 108 of the electrical module 102 extends into the electrical module 102.

In accordance with the embodiment as depicted in FIG. 6, the joiner assembly 320 includes the top side panel 214 in which the registration feature 108 forms a rectangular-shaped groove formed in the top side panel 214, and the registration feature 108 faces outwardly. There are four instances of the magnet 110 and four instances of the circuit terminal 112 mounted in the registration feature 108 (formed by the top side panel 214). The joiner assembly 320 includes the bottom side panel 216 in which the registration feature 108 forms a rectangular-shaped groove formed in the bottom side panel 216, and the registration feature 108 faces outwardly. There are four instances of the magnet 110 and four instances of the circuit terminal 112 mounted in the registration feature 108 (formed by the bottom side panel 216).

The connection housing 204 securely supports and encloses a connection electrical circuit 206. Preferably, the connection housing 204 supports and encloses the connection electrical circuit 206 in such a way that the connection housing 204 substantially protects the connection electrical circuit 206 from inadvertent (unwanted) physical damage. Embodiments of the connection electrical circuit 206 are depicted in FIG. 8 and FIG. 9. In accordance with a preferred embodiment as depicted in FIG. 6, the connection housing 204 includes housing-panel sections (preferably, a quantity of eight such panels) that are positioned and affixed to each other. This is done in such a way that the housing-panel sections securely surround the interior of the connection housing 204 (to keep the interior safe from unwanted damage, etc.). The connection housing 204 forms an elongated box structure (preferably having rectangular-shaped sides and/or square-shaped sides). Preferably, the housing-panel sections (of the connection housing 204) include a top side panel 114, a bottom side panel 116, a front side panel 118, a back side panel 120, a right side panel 122 and a left side panel 124.

In accordance with the embodiment as depicted in FIG. 17, the connection electrical circuit 206 is entirely enclosed by the connection housing 204. The connection housing 204 is configured to physically protect and shield the contents (such as, the connection electrical circuit 206) housed in the interior of the connection housing 204 (from unwanted damage). Preferably, the connection electrical circuit 206 is electrically connected (operatively coupled) to the connection magnet 210. It will be appreciated that the connection electrical circuit 206 may include any one of a complete electrical circuit or a partial electrical circuit (an incomplete electrical circuit). It will be appreciated that the connection electrical circuit 206 may include any type of electrical or electronic component, such as a wire configured to convey an electrical current, a resistor element, a capacitor element, a battery, a battery management system, a fuse element, an inductor element, a transistor element, a micro-controller, etc., and any combination and/or permutation thereof (and any equivalent thereof, all known and not depicted explicitly per se and not described). It will be appreciated that a portion of the connection electrical circuit 206 may extend (at least in part) from the interior of the connection housing 204 to the exterior of the connection housing 204. For instance, the connection circuit terminal 212 (or a pair of connection circuit terminal 212) of the connection electrical circuit 206 may extend from the interior of the connection housing 204 to the exterior of the connection housing 204, or may be exposed to the exterior of the connection housing 204. Each instance of the connection magnet 210 has a corresponding instance of the connection circuit terminal 212 configured to make physical contact with an instance of the connection magnet 210 (preferably, on a one-to-one correspondence).

The connection registration feature 208 is positioned relative to an outer surface of the connection housing 204. The connection registration feature 208 is configured to be in registered alignment with the registration feature 108 once the electrical module 102 is positioned relative to the connection module 202 just so. Preferably, the connection registration feature 208 is configured to mate with (connect with) the registration feature 108 once the electrical module 102 is positioned relative to the connection module 202 just so. Preferably, the connection registration feature 208 is positioned proximate to an outer surface of the connection housing 204. More preferably, the connection registration feature 208 is positioned, at least in part, on an outer surface of the connection housing 204. Even more preferably, the connection housing 204 forms (provides) the connection registration feature 208. The connection registration feature 208 is any one of (A) integral to the connection housing 204, and (B) configured to be connectable to (directly or indirectly) and disconnectable from (directly or indirectly) the connection housing 204, etc. In accordance with the embodiment as depicted in FIG. 6 and FIG. 7, the connection registration feature 208 includes a protuberance (an elongated or extended protuberance) formed on the outer surface of the connection housing 204, in which the protuberance extends above (outwardly from) the outer surface of the connection housing 204. Preferably, the connection magnet 210 is positioned in (or on) the protuberance (the connection registration feature 208). More preferably, the connection magnet 210 is positioned and is supported, at least in part, by the protuberance (the connection registration feature 208). This is done in such a way that an outer surface of the connection magnet 210 is recessed above the outer surface of the connection housing 204 (as depicted in FIG. 17). Preferably, the outer surface of the connection magnet 210 is positioned, at least in part, at the upper section of the protuberance (the connection registration feature 208). The protuberance may include any physical device that protrudes from the connection housing 204 (such as a bump, a lump, a knob, a projection, a protrusion, a prominence, a swelling, an outcrop, an outgrowth, a jut, a jag, a snag, etc., and any equivalent thereof).

The connection circuit terminal 212 is supported by the connection housing 204. The connection circuit terminal 212 is electrically connected to the connection electrical circuit 206 (for instance, as depicted in FIG. 17). Preferably, the connection circuit terminal 212 is positioned relative to the connection magnet 210 (as depicted in FIG. 17). More preferably, the connection circuit terminal 212 is positioned relative to the connection magnet 210, and the connection magnet 210 is exposed, at least in part, on an exterior of the connection housing 204. Even more preferably, the connection circuit terminal 212 is positioned, at least in part, on a portion of the connection magnet 210 (and faces outwardly from an exterior of the connection housing 204). Referring to the embodiment as depicted in FIG. 18, the connection circuit terminal 212 is configured to make physical contact (electrical contact) with the circuit terminal 112 (preferably on a one-to-one correspondence basis), once the electrical module 102 and the connection module 202 are positioned to do just so (as depicted in FIG. 18). Preferably, for the case where the magnet 110 and the connection magnet 210 are magnetically attracted to each other, the connection circuit terminal 212 and the circuit terminal 112 make physical contact (electrical contact) with each other. Preferably, for the case where the magnet 110 and the connection magnet 210 are magnetically repelled from each other, the connection circuit terminal 212 and the circuit terminal 112 do not make physical contact (electrical contact) or refrain from making electrical contact with each other.

The connection magnet 210 is securely supported by the connection housing 204. The connection magnet 210 is positioned relative to the connection registration feature 208. Preferably (as depicted in FIG. 17), the connection magnet 210 is positioned proximate to the connection registration feature 208. More preferably (as depicted in FIG. 17), the connection magnet 210 is positioned, at least in part, within the connection registration feature 208. Even more preferably (as depicted in FIG. 17), the connection magnet 210 is electrically connected (operatively coupled) to the connection electrical circuit 206.

The connection magnet 210 is configured to be magnetically attracted to the magnet 110, depending on magnetic polarity and once the electrical module 102 is positioned relative to the connection module 202. This is done in such a way that the connection registration feature 208 is positioned in registered alignment with the registration feature 108, and the circuit terminal 112 and the connection circuit terminal 212 become electrically connected with each other so that the electrical circuit 106 and the connection electrical circuit 206 become electrically connected with each other.

The connection magnet 210 is also configured to be magnetically repelled from the magnet 110, depending on magnetic polarity and once the electrical module 102 is positioned relative to the connection module 202. This is done in such a way that the connection registration feature 208 is positioned in unregistered alignment with the registration feature 108, and the circuit terminal 112 and the connection circuit terminal 212 become electrically disconnected from each other so that the electrical circuit 106 and the connection electrical circuit 206 become electrically disconnected from each other.

Referring to the embodiments as depicted in FIG. 6 to FIG. 18 (and may be applicable to other FIGS.), the apparatus 200 includes (and is not limited to) a connection module 202. The connection module 202 is configured to be spatially aligned and positioned relative to the electrical module 102. The connection module 202 includes a synergetic combination of a connection electrical circuit 206, a connection housing 204, a connection registration feature 208, a connection circuit terminal 212 and a connection magnet 210.

The connection electrical circuit 206 may include any number of electronic or electrical components and/or devices (such as, a resistor, a capacitor, an inductor, a wire, a battery, a switch, a transistor, a micro-controller, etc.)

The connection housing 204 is configured to securely protect (enclose and support) the connection electrical circuit 206.

The connection registration feature 208 is fixedly positioned relative to (on, or least in part on) an outer surface of the connection housing 204. The connection registration feature 208 is configured to be mated (fitted) with the registration feature 108. The connection registration feature 208 is configured to be aligned in registered relationship with (unified with, united with, joined to, merged with) the registration feature 108 once the connection module 202 and the electrical module 102 are spatially aligned and positioned relative to each other.

The connection circuit terminal 212 is supported by (affixed to, positioned at, at least in part, on an outer surface of) the connection housing 204. The connection circuit terminal 212 is electrically connected to the connection electrical circuit 206. The connection circuit terminal 212 is spatially positioned relative to the connection registration feature 208. The connection circuit terminal 212 is configured to be spatially positioned and aligned (spatially registered) relative to the circuit terminal 112 (once the connection registration feature 208 is aligned in registered relationship with the registration feature 108). The connection circuit terminal 212 is configured to be electrically connected with the circuit terminal 112 (this is done in such a way that the connection electrical circuit 206 and the electrical circuit 106 become electrically connected with each other).

The connection magnet 210 is securely supported by (affixed to, positioned at, at least in part, on an outer surface of) the connection housing 204. The connection magnet 210 is spatially positioned relative to the connection registration feature 208. The connection magnet 210 is configured to be spatially positioned and aligned (spatially registered) relative to the magnet 110 (once the connection registration feature 208 is aligned in registered relationship with the registration feature 108).

The apparatus 200 is further adapted, such that the connection magnet 210 is configured to be magnetically attracted to the magnet 110 (once the connection magnet 210 and the magnet 110 are spatially positioned for such magnetic attraction). This is done in such a way that the connection registration feature 208 and the registration feature 108 become mated (unified, united, joined, merged, etc.) with each other, and the connection circuit terminal 212 and the circuit terminal 112 become electrically connected with each other to, thereby, cause the connection electrical circuit 206 and the electrical circuit 106 to become electrically connected with each other.

The apparatus 200 is further adapted, such that the connection magnet 210 is configured to be magnetically repelled from the magnet 110 (once the connection magnet 210 and the magnet 110 are spatially positioned for such magnetic repulsion). This is done in such a way that the connection registration feature 208 and the registration feature 108 cannot (do not) become mated with each other, and the connection circuit terminal 212 and the circuit terminal 112 remain electrically disconnected with each other to, thereby, cause the connection electrical circuit 206 and the electrical circuit 106 to remain electrically disconnected with each other.

In accordance with the embodiment as depicted in FIG. 8 and FIG. 9, the instances of the magnet 110 are magnetically attracted to respective instances of the connection magnet 210. As a result, the registration feature 108 and the connection registration feature 208 are mated (fitted) with each other (as depicted in FIG. 9).

In accordance with the embodiment as depicted in FIG. 11, the instance of the battery assembly 300 that is positioned above the connection module 202 (or the joiner assembly 320) is lifted and rotated 180 degrees, and then is positioned adjacent to the connection module 202 (or the joiner assembly 320).

In accordance with the embodiments as depicted in FIG. 12 and FIG. 13, the instances of the magnet 110 (for the electrical module 102 positioned above the connection module 202) are magnetically repelled from respective instances of the connection magnet 210. As a result, the registration feature 108 (for the electrical module 102 positioned above the connection module 202) and the connection registration feature 208 cannot be (do not become) mated with each other (as depicted in FIG. 13).

In accordance with the embodiments as depicted in FIG. 12 and FIG. 13, the instances of the magnet 110 (for the electrical module 102 positioned below the connection module 202) are magnetically attracted to respective instances of the connection magnet 210. As a result, the registration feature 108 (for the electrical module 102 positioned below the connection module 202) and the connection registration feature 208 may be mated with each other (as depicted in FIG. 13).

FIG. 19, FIG. 20, FIG. 21, FIG. 22, FIG. 23, FIG. 24, FIG. 25 and FIG. 26 depict views of embodiments of the apparatus 200 of FIG. 6. FIG. 19 and FIG. 20 depict perspective views of embodiments of the apparatus 200 of FIG. 6. FIG.

Figure 26:
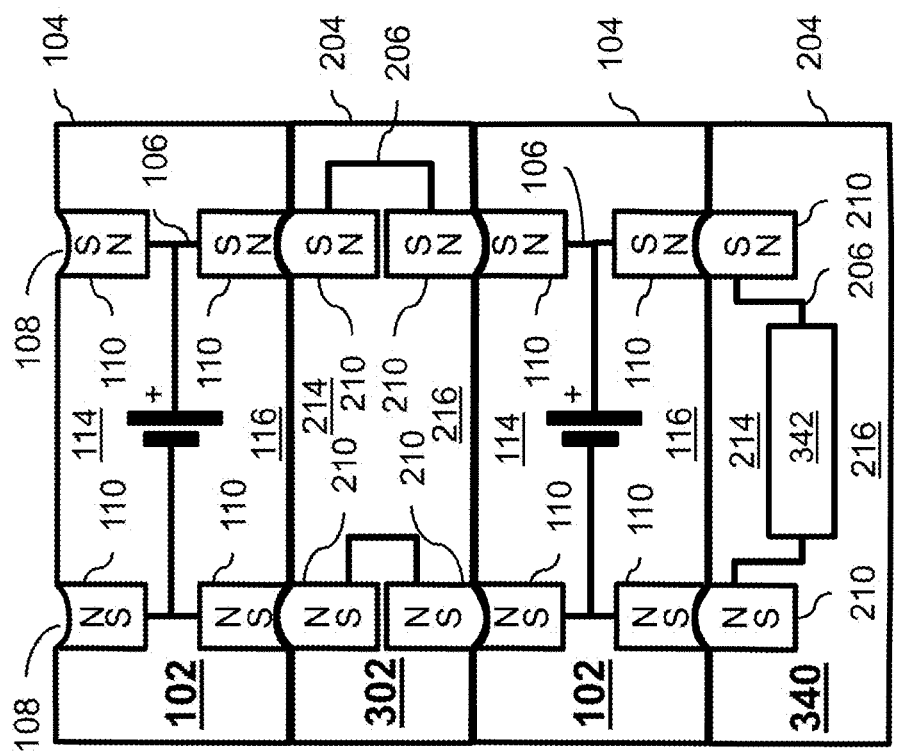
Figure 25:
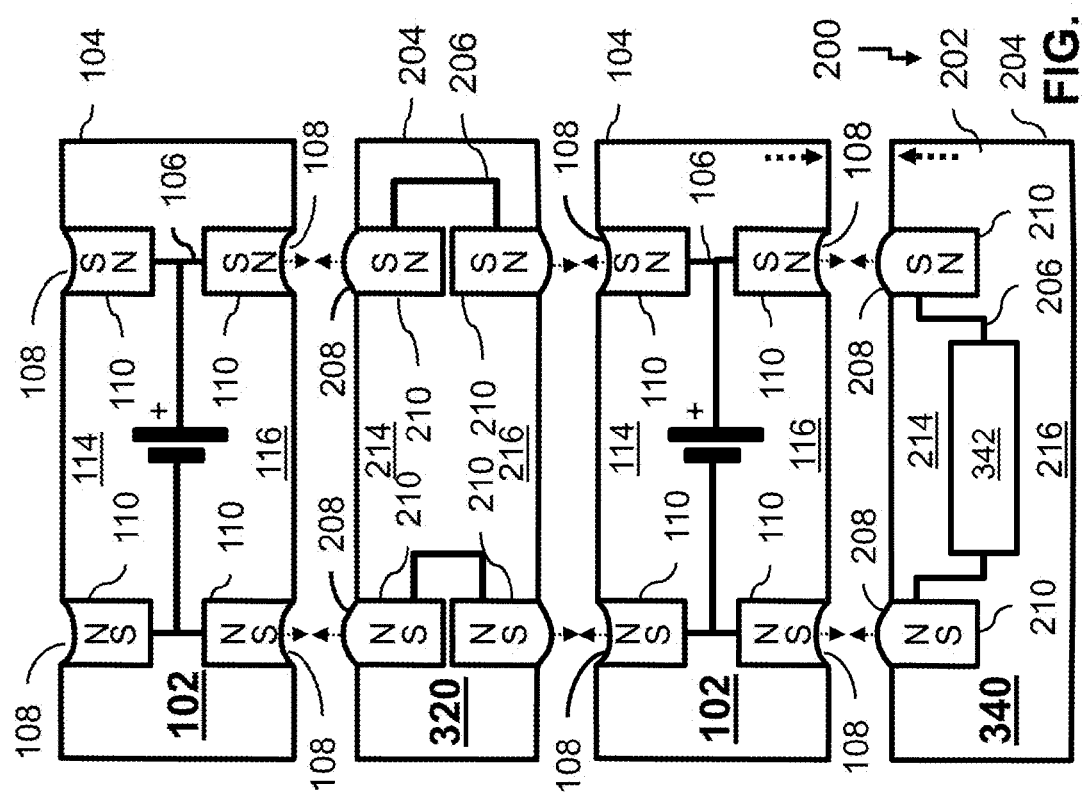

21 and FIG. 22 depict schematic views of embodiments of an interior of the apparatus 200 of FIG. 19. FIG. 23 and FIG. 24 depict perspective views of embodiments of the apparatus 200 of FIG. 19. FIG. 25 depicts a schematic view of an embodiment of an interior of the apparatus 200 of FIG. 23. FIG. 26 depicts a schematic view of an embodiment of an interior of the apparatus 200 of FIG. 24.

In accordance with a specific or a preferred embodiment as depicted in FIG. 19 (and equally applicable to the embodiments depicted in FIG. 20, FIG. 21, FIG. 22, FIG. 23, FIG. 24, FIG. 25 and FIG. 26), the connection module 202 includes (and is not limited to) or is a part of an inverter assembly 340 configured to receive electrical power from the electrical module 102 once operatively connected to the electrical module 102 just so. More preferably, the connection module 202 includes (and is not limited to) or is a part of the inverter assembly 340, and the electrical module 102 includes (and is not limited to) the battery assembly 300.

The inverter assembly 340 includes an inverter unit 342. The inverter assembly 340 may be called a power inverter or an inverter. The inverter assembly 340 is an electronic device or circuitry that changes direct current (DC) to alternating current (AC). The input voltage, output voltage and frequency, and overall power handling depend on the design of the specific device or circuitry. The inverter does not produce any power; the power is provided by the DC source. A power inverter can be entirely electronic or may be a combination of mechanical effects (such as a rotary apparatus) and electronic circuitry.

The inverter assembly 340 may include, by way of an embodiment, a power outlet 343, a computer peripheral outlet 344 (a Universal Bus Port or USB) and a vent port 346, etc.

Referring to the embodiment as depicted in FIG. 21, the magnet 110 is magnetically attracted to respective instances of the connection magnet 210.

Referring to the embodiment as depicted in FIG. 22, the inverter assembly 340 includes instances of the connection magnet 210 positioned on opposite sides of the inverter assembly 340 (top and bottom sides, for instance).

Referring to the embodiment as depicted in FIG. 23 and FIG. 24, a stack is formed that includes the inverter assembly 340, a first instance of the electrical module 102 connected to the inverter assembly 340, the joiner assembly 320 connected to the first instance of the electrical module 102, and joiner assembly 320 connected to a second instance of the electrical module 102. The joiner assembly 320 is positioned between the first instance of the electrical module 102 and the second instance of the electrical module 102.

Referring to the embodiment as depicted in FIG. 25 and FIG. 26, the instances of the magnet 110 are magnetically attracted to instances of the connection magnet 210 (once positioned as depicted, in registered alignment).

Figure 28:
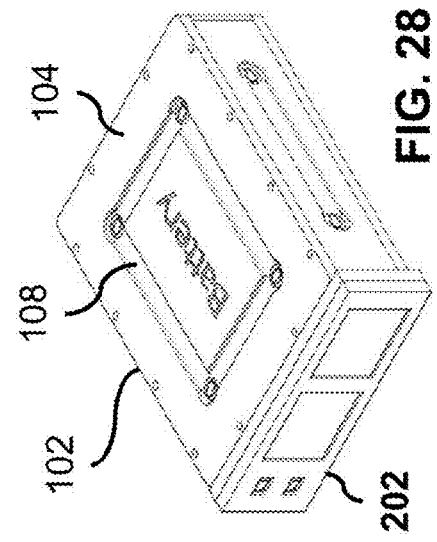
FIG. 27, FIG. 28 and FIG. 29 (SHEET 12 OF 21 SHEETS) depict views of embodiments of the apparatus of FIG. 6.
Figure 27:
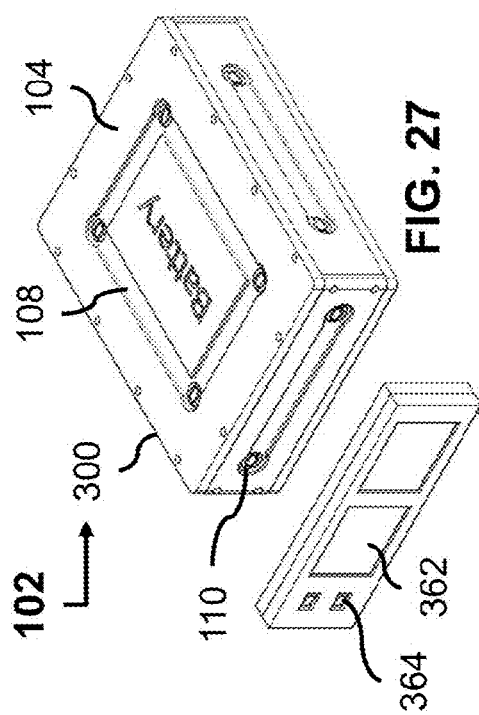
Figure 29:
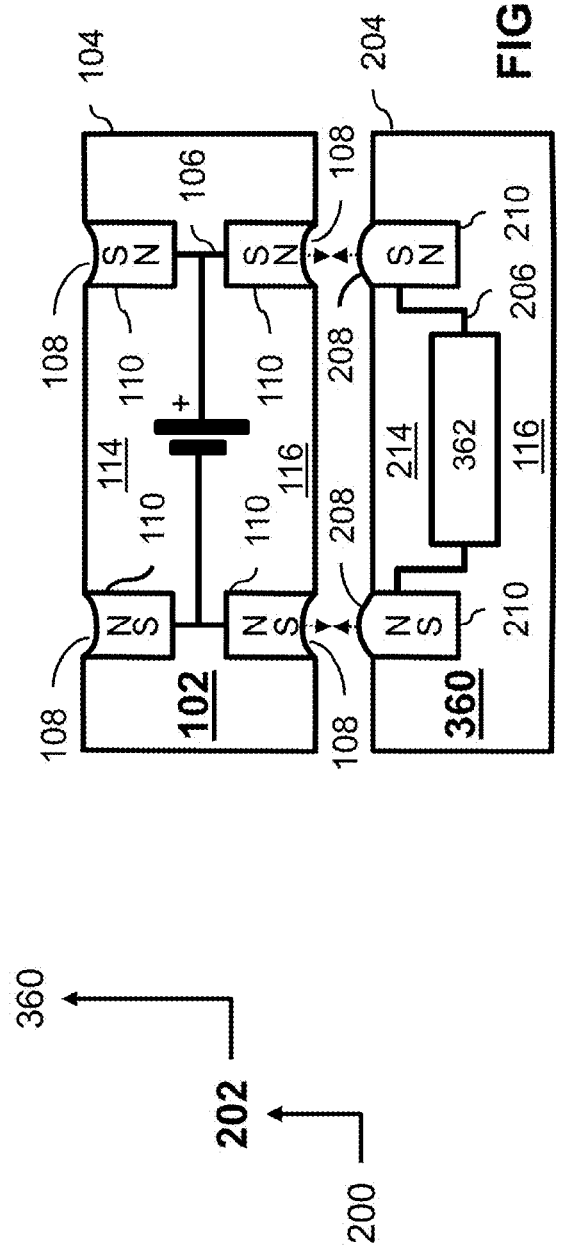

FIG. 27, FIG. 28 and FIG. 29 depict views of embodiments of the apparatus 200 of FIG. 6. FIG. 27 and FIG. 28 depict perspective views of embodiments of the apparatus 200 of FIG. 6. FIG. 29 depicts a schematic view of an embodiment of an interior of the apparatus 200 of FIG. 27.

In accordance with a specific or a preferred embodiment as depicted in FIG. 30 (and equally applicable to the embodiments as depicted in FIG. 31, FIG. 32 and FIG. 33), the connection module 202 includes (and is not limited to) or is a part of a light assembly 360. More preferably, the connection module 202 includes (and is not limited to) or is a part of the light assembly 360, and the electrical module 102 includes (and is not limited to) the battery assembly 300. The light assembly 360 includes a light-emitting element 362 (such as a light emitting diode, etc.) and a switch element 364 connected to the light-emitting element 362.

FIG. 30, FIG. 31, FIG. 32 and FIG. 33 depict views of embodiments of the apparatus 200 of FIG. 6. FIG. 30 and FIG. 31 depict perspective views of embodiments of the apparatus 200 of FIG. 6. FIG. 32 and FIG. 33 depict perspective views of embodiments of the apparatus 200 of FIG. 6.

In accordance with specific or preferred embodiments as depicted in FIG. 30, FIG. 31, FIG. 32 and FIG. 33, the apparatus 200 further includes (and is not limited to) a handle assembly 380 configured to be magnetically coupled to the electrical module 102. More preferably, the apparatus 200 further includes (and is not limited to) the handle assembly 380, and the electrical module 102 includes (and is not limited to) the battery assembly 300. The handle assembly 380 includes a base section 382, and a handle portion 384.

Figure 34:
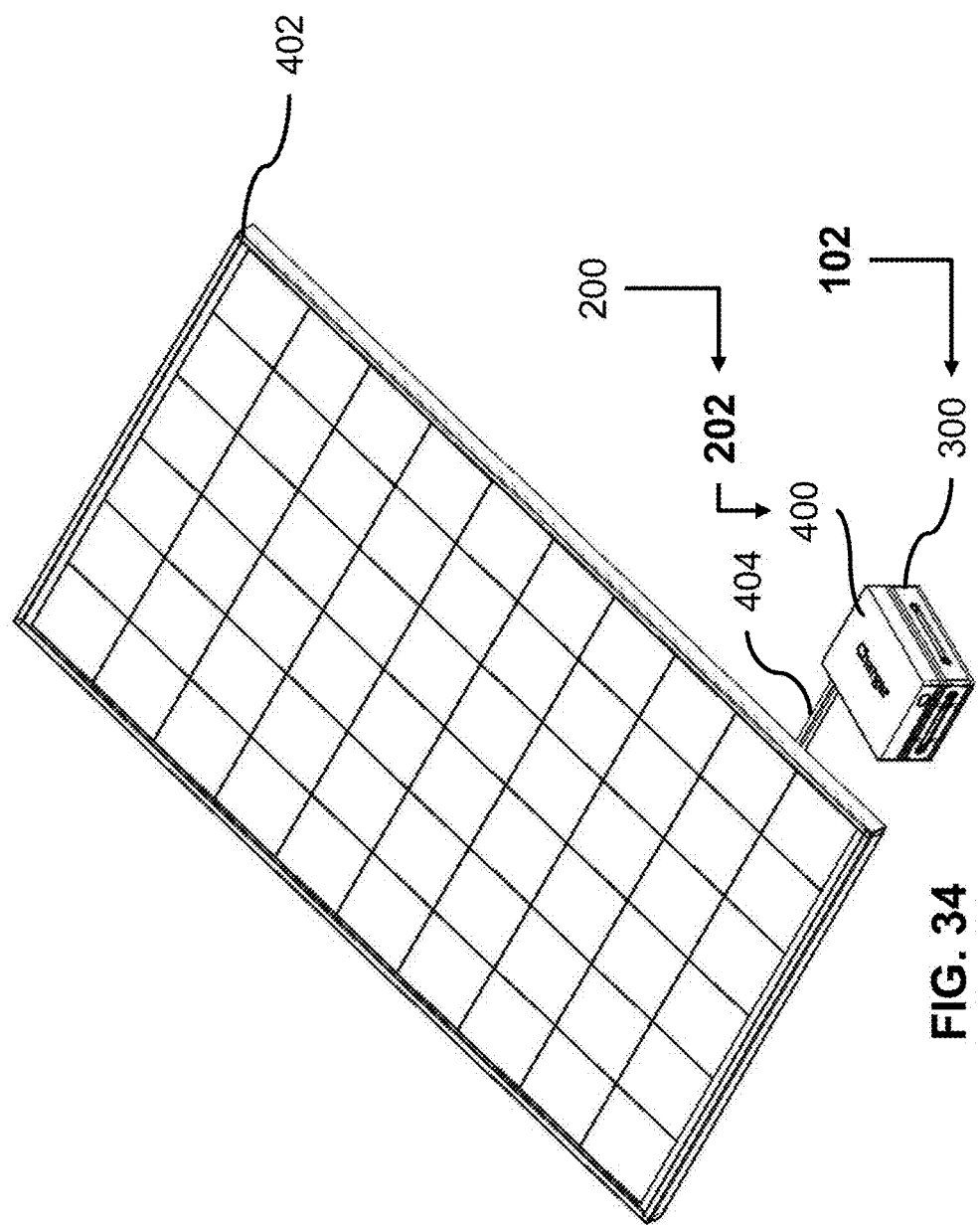

FIG. 34, FIG. 35, FIG. 36, FIG. 37 and FIG. 38 depict views of the apparatus 200 of FIG. 6. FIG. 34, FIG. 35 and FIG. 36 depict perspective views of embodiments of the apparatus 200 of FIG. 6. FIG. 37 and FIG. 38 depict schematic views of embodiments of an interior of the apparatus 200 of FIG. 36.

In accordance with specific or preferred embodiments as depicted in FIG. 34 (and equally applicable to the embodiments as depicted in FIG. 35, FIG. 36, FIG. 37 and FIG. 38), the connection module 202 includes (and is not limited to) or is a part of an electrical-charging assembly 400 configured to electrically charge the electrical module 102 once operatively connected to do just to. More preferably, the connection module 202 includes (and is not limited to) or is a part of the electrical-charging assembly 400, and the electrical module 102 includes (and is not limited to) the battery assembly 300. The electrical-charging assembly 400 is configured to be operatively connected to a solar panel assembly 402. The electrical-charging assembly 400 is configured to electrically charge a drained battery (as depicted in FIG. 35). A panel wire 404 is configured to electrically connect the electrical-charging assembly 400 to the solar panel assembly 402. The electrical-charging assembly 400 includes a power switch 406. The electrical-charging assembly 400 may be called a battery charger or recharger. The electrical-charging assembly 400 is configured to put electrical energy into a rechargeable battery by forcing an electric current through the battery. The charging protocol depends on the size and type of the battery to be charged.

In accordance with the embodiment as depicted in FIGS. 37 and 38, the electrical-charging assembly 400 includes a charger unit 408 configured to charge the battery contained (housed) in the electrical module 102.

Figure 41:
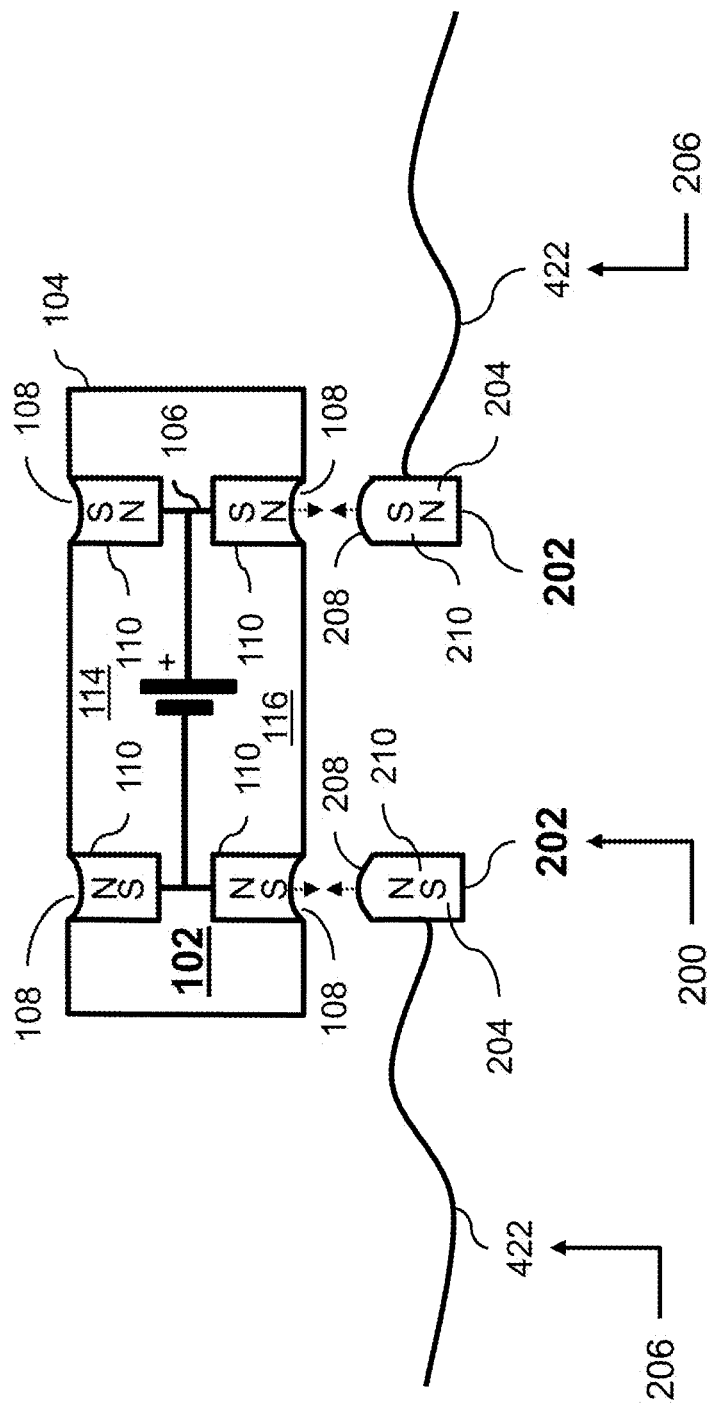

FIG. 39, FIG. 40 and FIG. 41 depict views of embodiments of the apparatus 200 of FIG. 6. FIG. 39 and FIG. 40 depict perspective views of embodiments of the apparatus 200 of FIG. 6. FIG. 41 depicts a schematic view of an embodiment of an interior of the apparatus 200 of FIG. 39.

In accordance with a specific or a preferred embodiment as depicted in FIG. 39 (and equally applicable to the embodiments as depicted in FIG. 40 and FIG. 41), the connection module 202 includes (and is not limited to) or is a part of a wiring-connection assembly 420. More preferably, the connection module 202 includes (and is not limited to) or is a part of the wiring-connection assembly 420, and the electrical module 102 includes (and is not limited to) the battery assembly 300. The wiring-connection assembly 420 includes an electrical conductor 422 (a wire, and more preferably an electrically insulated wire).

FIG. 42, FIG. 43, FIG. 44, FIG. 45 and FIG. 46 depict views of embodiments of the apparatus 200 of FIG. 6. FIG. 42, FIG. 43 and FIG. 44 depict perspective views of embodiments of the apparatus 200 of FIG. 6. FIG. 45 depicts a schematic view of an embodiment of an interior of the apparatus 200 of FIG. 44. FIG. 46 depicts a schematic view of an embodiment of an interior of the apparatus 200 of FIG. 43.

In accordance with a specific or a preferred embodiment as depicted in FIG. 42 (and equally applicable to the embodiment as depicted in FIG. 43, FIG. 44, FIG. 45 and FIG. 46), the connection module 202 includes (and is not limited to) or is part of a backplane assembly 440 configured to receive a plurality of the electrical module 102. More preferably, the connection module 202 includes (and is not limited to) or is part of the backplane assembly 440, and the electrical module 102 includes (and is not limited to) the battery assembly 300. The backplane assembly 440 includes backplane terminals 442.

Referring to the embodiment as depicted in FIG. 42, the backplane assembly 440 includes three sidewalls with one side open for receiving instances of the electrical module 102. The backplane assembly 440 is configured to electrically connect with the instances of the electrical module 102.

Referring to the embodiment as depicted in FIG. 43, the sidewalls of the backplane assembly 440 are removed to better show the instances of the electrical module 102.

Referring to the embodiment as depicted in FIG. 44, the instances of the electrical module 102 have been disconnected from the backplane assembly 440.

Referring to the embodiments as depicted in FIG. 45 and FIG. 46, the instances of the magnet 110 are magnetically attracted to the instances of the connection magnet 210 as depicted and aligned relative to each other (as positioned, as such).

Additional Description

The electrical module 102 may include a housing that may be manufactured by using a 3D printing machine or may be manufactured by using an injection molding system, etc., or by any other type of manufacturing system.

The housing 104 may be manufactured by using a 3D printing machine or by an injection molding system with a mold assembly, if so desired, etc., or by any other type of manufacturing system.

The registration feature 108 may be manufactured by using a 3D printing machine or may be manufactured by using an injection molding system, etc., or by any other type of manufacturing system.

The magnet 110 may include the Model MAGNET6 magnet manufactured or supplied by VELLEMAN INC. (Belgium), and any equivalent thereof.

The circuit terminal 112 includes an electrically conductive material, and any equivalent thereof.

The connection housing 204 (and components thereof) may be manufactured using a 3D printing machine or may be manufactured by using an injection molding system, etc., or by any other type of manufacturing system.

The connection registration feature 208 may be manufactured by using a 3D printing machine or may be manufactured by using an injection molding system, etc., or by any other type of manufacturing system.

The connection magnet 210 may include the Model MAGNET6 magnet manufactured or supplied by VELLEMAN INC. (Belgium), and any equivalent thereof.

The connection circuit terminal 212 may be manufactured by a 3D printing machine, and may include a combination of a magnet portion and a wire conductor, and any equivalent thereof.

The battery assembly 300 includes a housing that may be manufactured by using a 3D printing machine or by an injection molding system with a mold assembly, if so desired, or by any other type of manufacturing system.

The battery 302 may include the Lithium Iron Phosphate (LiFePO4, LFE) rechargeable battery, such as the MODEL AMP20M1HD-A manufactured or supplied by A123 Systems (U.S.A.), and any equivalent thereof.

The joiner assembly 320 may be manufactured by using a 3D printing machine or may be manufactured by using an injection molding system, etc., or by any other type of manufacturing system.

The inverter assembly 340 may include any suitable inverter assembly manufactured or supplied by SamlexAmerica (Canada), such as the MODEL PST-120-12 inverter assembly (or larger), and any equivalent thereof.

The inverter unit 342 may include any suitable inverter unit manufactured by SamlexAmerica (Canada), such as the MODEL PST-120-12 inverter unit (or larger), and any equivalent thereof.

The power outlet 343 may include any suitable power outlet (such as the NEMA 5-15R electrical outlet manufactured to follow National Electrical Manufacturers Association standards), and any equivalent thereof.

The USB outlet 344 (Universal Serial Bus) is a standard bus configured to provide power to charge many types of computer peripherals and/or electronic devices.

The vent port 346 may be manufactured by using a 3D printing machine or may be manufactured by using an injection molding system, etc., or by any other type of manufacturing system.

The light assembly 360 includes a housing that may be manufactured by using a 3D printing machine or may be manufactured by using an injection molding system, etc., or by any other type of manufacturing system.

The light-emitting element 362 preferably includes a low-power consumption lamp, such as an LED (light emitting diode) or an array of LEDs, etc., and any equivalent thereof.

The switch element 364 may include any type of switch element manufactured by TYCO (Ireland), and any equivalent thereof.

The handle assembly 380 may be manufactured by using a 3D printing machine or may be manufactured by using an injection molding system, etc., or by any other type of manufacturing system.

The solar panel assembly 402 may be any type of solar panel manufactured by Canadian Solar (Canada) or by INVENSUN (Canada), such as the MODEL SUNDRAGON (TRADEMARK) i80 solar panel assembly, and any equivalent thereof.

The power switch 406 includes any suitable power switch manufactured by TYCO (Ireland), and any equivalent thereof.

The charger unit 408 includes any suitable charger unit manufactured by DNM SOLAR (Canada), and any equivalent thereof.

The wiring-connection assembly 420 may be 3D printed, and may include a combination of a magnet portion, such as the Model MAGNET6 magnet manufactured or supplied by VELLEMAN INC. (Belgium), and a wire conductor (of suitable and appropriate gauge), and any equivalents thereof.

The electrical conductor 422 may include any suitable electrical conductive wire of suitable and appropriate gauge, and any equivalent thereof.

The backplane assembly 440 includes any type of backplane assembly, such as the MODEL DNM BKP0105 backplane assembly manufactured by DNM Solar (Canada), and any equivalent thereof.

The backplane terminals 442 may include any suitable backplane terminals manufactured by DNM Solar Magnetic/Electric backplane terminals, and any equivalent thereof.

This written description uses examples to disclose the invention, including the best mode, and also to enable any person skilled in the art to make and use the invention. The patentable scope of the invention is defined by the claims, and may include other examples that occur to those skilled in the art. Such other examples are within the scope of the claims if they have structural elements that do not differ from the literal language of the claims, or if they include equivalent structural elements with insubstantial differences from the literal language of the claims.

It may be appreciated that the assemblies and modules described above may be connected with each other as required to perform desired functions and tasks within the scope of persons of skill in the art to make such combinations and permutations without having to describe each and every one in explicit terms. There is no particular assembly or component that may be superior to any of the equivalents available to the person skilled in the art. There is no particular mode of practicing the disclosed subject matter that is superior to others, so long as the functions may be performed. It is believed that all the crucial aspects of the disclosed subject matter have been provided in this document. It is understood that the scope of the present invention is limited to the scope provided by the independent claim(s), and it is also understood that the scope of the present invention is not limited to: (i) the dependent claims, (ii) the detailed description of the non-limiting embodiments, (iii) the summary, (iv) the abstract, and/or (v) the description provided outside of this document (that is, outside of the instant application as filed, as prosecuted, and/or as granted). It is understood, for this document, that the phrase "includes" is equivalent to the word "comprising." The foregoing has outlined the non-limiting embodiments (examples). The description is made for particular non-limiting embodiments (examples). It is understood that the non-limiting embodiments are merely illustrative as examples.

What is claimed is:

1. An apparatus for use with an electrical module including a housing securely supporting and enclosing an electrical circuit, a registration feature positioned on an outer surface of the housing, a circuit terminal supported by the housing, and the circuit terminal being electrically connected to the electrical circuit, and a magnet securely supported by the housing, and the circuit terminal being located atop, and being extended, at least in part, across, the magnet, and the apparatus comprising:
    a connection module including:
        a connection housing securely supporting and enclosing a connection electrical circuit; and
        a connection registration feature positioned on an outer surface of the connection housing, and the connection registration feature being configured to be in registered alignment with the registration feature once the electrical module is positioned adjacent to the connection module just so; and
        a connection circuit terminal being supported by the connection housing, and the connection circuit terminal being electrically connected to the connection electrical circuit; and
        a connection magnet securely supported by the connection housing; and
        the connection circuit terminal being located atop, and being extended, at least in part, across, the connection magnet; and
        the connection magnet being configured to be magnetically attracted to the magnet once the connection magnet and the magnet are spatially positioned for such magnetic attraction in such a way that:
            the connection circuit terminal electrically couples with the circuit terminal, in which the connection circuit terminal is located atop and is extended, at least in part, across the connection magnet of the connection module, and in which the circuit terminal is located atop and is extended, at least in part, across the magnet of the electrical module; and
            electrical current is exchangeable between the connection circuit terminal of the connection module and the circuit terminal of the electrical module once the connection circuit terminal, in use, electrically couples with the circuit terminal; and
        the connection magnet being configured to be magnetically repelled from the magnet once the connection magnet and the magnet are spatially positioned for such magnetic repulsion in such a way that:
            the connection circuit terminal remains electrically uncoupled from the circuit terminal, in which the connection circuit terminal is located atop and is extended, at least in part, across the connection magnet of the connection module, and in which the circuit terminal is located atop and is extended, at least in part, across the magnet of the electrical module; and
            electrical current is not exchangeable between the connection circuit terminal of the connection module and the circuit terminal of the electrical module.

2. An apparatus for use with an electrical module including a housing securely protecting an electrical circuit, and a registration feature being positioned on an outer surface of the housing, and a circuit terminal being supported by the housing, and the circuit terminal being electrically connected to the electrical circuit, and a magnet being securely supported by the housing, and the circuit terminal being located atop, and being extended, at least in part, across, the magnet, and the apparatus comprising:
    a connection module being configured to be spatially aligned and positioned adjacent to the electrical module; and
    the connection module, including:
        a connection electrical circuit; and
        a connection housing being configured to securely protect the connection electrical circuit; and
        a connection registration feature being fixedly positioned on an outer surface of the connection housing, and the connection registration feature being configured to be mated with the registration feature, and the connection registration feature being configured to be aligned in registered relationship with the registration feature once the connection module and the electrical module are spatially aligned and positioned adjacent to each other; and a connection circuit terminal being supported by the connection housing, and the connection circuit terminal being electrically connected to the connection electrical circuit, and the connection circuit terminal being configured to be spatially positioned and aligned adjacent to the circuit terminal once the connection registration feature is aligned in registered relationship with the registration feature, and the connection circuit terminal being configured to be electrically connected with the circuit terminal in such a way that the connection electrical circuit and the electrical circuit become electrically connected with each other; and a connection magnet being securely supported by the connection housing, and the connection magnet being configured to be spatially positioned and aligned adjacent to the magnet once the connection registration feature is aligned in registered relationship with the registration feature; and the connection circuit terminal being located atop, and being extended, at least in part, across, the connection magnet; and the connection magnet being configured to be magnetically attracted to the magnet once the connection magnet and the magnet are spatially positioned for such magnetic attraction in such a way that:

the connection circuit terminal electrically couples with the circuit terminal, in which the connection circuit terminal is located atop and is extended, at least in part, across the connection magnet of the connection module, and in which the circuit terminal is located atop and is extended, at least in part, across the magnet of the electrical module; and electrical current is exchangeable between the connection circuit terminal of the connection module and the circuit terminal of the electrical module once the connection circuit terminal, in use, electrically couples with the circuit terminal; and the connection magnet being configured to be magnetically repelled from the magnet once the connection magnet and the magnet are spatially positioned for such magnetic repulsion in such a way that:

the connection circuit terminal remains electrically uncoupled from the circuit terminal, in which the connection circuit terminal is located atop and is extended, at least in part, across the connection magnet of the connection module, and in which the circuit terminal is located atop and is extended, at least in part, across the magnet of the electrical module; and electrical current is not exchangeable between the connection circuit terminal of the connection module and the circuit terminal of the electrical module.

3. The apparatus of claim 2, wherein:
the connection magnet is configured to be magnetically attracted to the magnet once the connection magnet and the magnet are spatially positioned for such magnetic attraction in such a way that the connection registration feature and the registration feature become mated with each other, and the connection circuit terminal and the circuit terminal become electrically connected with each other, thereby, causing the connection electrical circuit and the electrical circuit to become electrically connected with each other.

4. The apparatus of claim 3, wherein:
the connection magnet is configured to be magnetically repelled from the magnet once the connection magnet and the magnet are spatially positioned for such magnetic repulsion in such a way that the connection registration feature and the registration feature cannot become mated with each other, and the connection circuit terminal and the circuit terminal remain electrically disconnected from each other to, thereby, causing the connection electrical circuit and the electrical circuit to remain electrically disconnected from each other.

5. The apparatus of claim 4, wherein:
the electrical module includes:
a battery assembly having a battery.

6. The apparatus of claim 4, wherein:
the connection module includes:
a joiner assembly being configured to electrically couple an instance of the electrical module with another instance of the electrical module.

7. The apparatus of claim 4, wherein:
the electrical module includes:
a battery assembly having a battery; and
the connection module includes:
a joiner assembly being configured to electrically couple an instance of the battery assembly with another instance of the battery assembly.

8. The apparatus of claim 7, wherein:
the battery assembly has the registration feature in which the registration feature is recessed, and the battery assembly cannot be connected to another instance of the battery assembly without usage of the joiner assembly.

9. The apparatus of claim 4, wherein:
the connection registration feature extends outwardly from the connection module; and
the registration feature of the electrical module extends into the electrical module.

10. The apparatus of claim 4, wherein:
the connection housing includes:
housing-panel sections positioned and affixed to each other.

11. The apparatus of claim 4, wherein:
the connection electrical circuit is entirely enclosed by the connection housing.

12. The apparatus of claim 4, wherein:
the connection registration feature is positioned, at least in part, on the outer surface of the connection housing.

13. The apparatus of claim 4, wherein:
the connection circuit terminal is positioned, at least in part, on a portion of the connection magnet and faces outwardly from an exterior of the connection housing.

14. The apparatus of claim 4, wherein:
the connection magnet is positioned, at least in part, within the connection registration feature; and
the connection magnet is electrically connected to the connection electrical circuit.

15. The apparatus of claim 4, wherein:
the connection module includes:
an inverter assembly being configured to receive electrical power from the electrical module once operatively connected to the electrical module just so.

16. The apparatus of claim 4, wherein:
the connection module includes:
a light assembly having a light-emitting element.

17. The apparatus of claim 4, further comprising:
a handle assembly being configured to be magnetically coupled to the electrical module.

18. The apparatus of claim 4, wherein:
the connection module includes:
- an electrical-charging assembly configured to electrically charge the electrical module once operatively connected to do just so.

19. The apparatus of claim 4, wherein:
the connection module includes:
- a wiring-connection assembly including an electrical conductor.

20. The apparatus of claim 4, wherein:
the connection module includes:
- a backplane assembly configured to receive a plurality of the electrical module.

* * * * *